(12) United States Patent
Nakamura et al.

(10) Patent No.: US 8,710,740 B2
(45) Date of Patent: Apr. 29, 2014

(54) PHOSPHOR ADHESIVE SHEET, LIGHT EMITTING DIODE ELEMENT INCLUDING PHOSPHOR LAYER, LIGHT EMITTING DIODE DEVICE, AND PRODUCING METHODS THEREOF

(75) Inventors: Toshitaka Nakamura, Osaka (JP); Hiroyuki Katayama, Osaka (JP); Haruka Fujii, Osaka (JP); Hironaka Fujii, Osaka (JP)

(73) Assignee: Nitto Denko Corporation, Osaka (JP)

( * ) Notice: Subject to any disclaimer, the term of this patent is extended or adjusted under 35 U.S.C. 154(b) by 123 days.

(21) Appl. No.: 13/524,230

(22) Filed: Jun. 15, 2012

(65) Prior Publication Data
US 2012/0319575 A1 Dec. 20, 2012

(30) Foreign Application Priority Data
Jun. 16, 2011 (JP) .................................. 2011-134578

(51) Int. Cl.
*H01J 1/62* (2006.01)
*H01J 63/04* (2006.01)

(52) U.S. Cl.
USPC ........... 313/512; 313/483; 313/500; 313/501; 313/502; 313/503; 313/504; 313/505; 313/506; 313/510; 313/511

(58) Field of Classification Search
None
See application file for complete search history.

(56) References Cited

U.S. PATENT DOCUMENTS 7,294,861 B2 11/2007 Schardt et al.
2007/0004065 A1 1/2007 Schardt et al.

*Primary Examiner* — Natalie Walford
(74) *Attorney, Agent, or Firm* — Sughrue Mion, PLLC

(57) ABSTRACT

A phosphor adhesive sheet includes a phosphor layer containing a phosphor and an adhesive layer laminated on one surface in a thickness direction of the phosphor layer. The adhesive layer is formed of a silicone resin composition having both thermoplastic and thermosetting properties.

12 Claims, 10 Drawing Sheets

(a)

(b)

(c)

(a)

(b)

(c)

15

(a)

7

(b)

7

PHOSPHOR ADHESIVE SHEET, LIGHT EMITTING DIODE ELEMENT INCLUDING PHOSPHOR LAYER, LIGHT EMITTING DIODE DEVICE, AND PRODUCING METHODS THEREOF

CROSS-REFERENCE TO RELATED APPLICATION

The present application claims priority from Japanese Patent Application No. 2011-134578 filed on Jun. 16, 2011, the contents of which are hereby incorporated by reference into this application.

BACKGROUND OF THE INVENTION

1. Field of the Invention

The present invention relates to a phosphor adhesive sheet, a light emitting diode element including a phosphor layer, a light emitting diode device, and producing methods thereof, to be specific, to a phosphor adhesive sheet, a producing method thereof, a light emitting diode element including a phosphor layer which includes the phosphor adhesive sheet, a producing method thereof, a light emitting diode device, and a producing method thereof.

2. Description of Related Art

In recent years, as a light emitting device that is capable of emitting high-energy light, a white light emitting device has been known. The white light emitting device is provided with, for example, an LED (light emitting diode) and a phosphor layer disposed thereon, and emits high-energy white light by color mixing of blue light, which is emitted from the LED and transmits through the phosphor layer, and yellow light, which is converted in wavelength from a part of the blue light in the phosphor layer.

As a method for obtaining the white light emitting device, for example, the following method has been proposed (ref: for example, U.S. Pat. No. 7,294,861).

That is, an LED package, which includes a package body in which a concave portion opening upward is formed, an LED provided at the bottom surface of the concave portion, and a sealing material (an encapsulating material) that seals in (encapsulates) the LED in the concave portion, is prepared. Separately, a phosphor tape, which includes a phosphor film containing YAG:Ce and a pressure-sensitive adhesive composed of an acrylic resin and laminated thereon, is prepared.

Thereafter, the phosphor tape is attached to the LED package such that the pressure-sensitive adhesive is in contact with the upper surface of the LED package, so that the white light emitting device is obtained.

SUMMARY OF THE INVENTION

However, in the method in U.S. Pat. No. 7,294,861, there may be a case where a concavity and convexity, and a wave are formed on the upper surface of the sealing material. In that case, the phosphor tape cannot conform to the upper surface of the sealing material, so that a gap is generated between the phosphor tape and the sealing material. This may result in a reduction in reliability of the white light emitting device.

In the phosphor tape in U.S. Pat. No. 7,294,861, there is a disadvantage that an attaching force (an adhesive force) is weak because the phosphor film is attached to the LED package simply by the pressure-sensitive adhesive.

In recent years, the pressure-sensitive adhesive of the phosphor tape is required to have an excellent durability such as heat resistance and light resistance, along with higher brightness and higher output power of the white light emitting device.

It is an object of the present invention to provide a phosphor adhesive sheet, which is capable of being temporarily fixed to an object, then is capable of being adhered thereto with an excellent adhesive force, and furthermore, has an excellent durability; a light emitting diode element including a phosphor layer and a light emitting diode device, which use the phosphor adhesive sheet and have an excellent reliability; and producing methods thereof.

A phosphor adhesive sheet of the present invention includes a phosphor layer containing a phosphor and an adhesive layer laminated on one surface in a thickness direction of the phosphor layer, wherein the adhesive layer is formed of a silicone resin composition having both thermoplastic and thermosetting properties.

In the phosphor adhesive sheet, the adhesive layer is plasticized by heating, so that the phosphor layer can be temporarily fixed to an object.

In the phosphor adhesive sheet, by the subsequent heating, the adhesive layer is cured by heating, so that the phosphor layer can be adhered to the object.

Additionally, in the phosphor adhesive sheet, by the plasticization of the adhesive layer, a gap can be prevented from being generated between the phosphor layer and the object or the adhesive layer can also conform to the object having a concavity and convexity. Therefore, by the subsequent curing by heating of the adhesive layer, the phosphor layer can be surely adhered to the object.

In addition, by the plasticization, the adhesive layer is formed into a predetermined shape or to be thin. Therefore, the thinning of the adhesive layer can be achieved.

Furthermore, the adhesive layer is cured by heating, so that the adhesive layer has an excellent durability.

In the phosphor adhesive sheet of the present invention, it is preferable that the phosphor layer is formed of a ceramic of the phosphor.

In the phosphor adhesive sheet, the adhesive layer is formed to be thin in the phosphor layer formed of the ceramic of the phosphor, so that heat generated by wavelength conversion of light can be efficiently thermal conducted to the outside via the adhesive layer.

In the phosphor adhesive sheet of the present invention, it is preferable that the phosphor layer is formed of a phosphor resin composition containing the phosphor and a resin.

In the phosphor adhesive sheet, the phosphor layer is formed of the phosphor resin composition, so that the phosphor layer can be easily formed into an arbitrary shape.

The method for producing a phosphor adhesive sheet of the present invention includes the steps of preparing a phosphor layer containing a phosphor, plasticizing a silicone resin composition having both thermoplastic and thermosetting properties to be laminated on one surface in a thickness direction of the phosphor layer, and forming an adhesive layer by cooling the silicone resin composition to be solidified.

In the method for producing the phosphor adhesive sheet, the silicone resin composition having both thermoplastic and thermosetting properties is plasticized to be laminated on one surface in the thickness direction of the phosphor layer, so that the adhesive layer can be easily and uniformly formed on one surface in the thickness direction of the phosphor layer.

In this method, the silicone resin composition is cooled to be solidified, so that the adhesive layer is formed. Therefore, the phosphor adhesive sheet including the adhesive layer can be produced with an excellent workability (handling ability).

A light emitting diode element including a phosphor layer of the present invention includes a light emitting diode element and a phosphor adhesive sheet laminated on at least one surface in a thickness direction of the light emitting diode element, wherein the phosphor adhesive sheet includes a phosphor layer containing a phosphor and an adhesive layer laminated on one surface in the thickness direction of the phosphor layer, and the adhesive layer is formed of a silicone resin composition having both thermoplastic and thermosetting properties.

In the light emitting diode element including a phosphor layer, the adhesive layer is adhered to at least one surface in the thickness direction of the light emitting diode element, so that the adhesive force of the phosphor layer with respect to the light emitting diode element is improved.

Also, when the adhesive layer is cured by heating, the durability of the light emitting diode element including a phosphor layer can be improved.

As a result, the reliability of the light emitting diode element including a phosphor layer can be improved.

A light emitting diode device of the present invention includes a light emitting diode package, which includes a board, a light emitting diode element mounted on the board, a reflector formed on one side in a thickness direction of the board and disposed so as to surround the light emitting diode element when projected in the thickness direction, and an encapsulating layer filled in the reflector and encapsulating the light emitting diode element; and a phosphor adhesive sheet, which is adhered to one surface in the thickness direction of the light emitting diode package, wherein the phosphor adhesive sheet includes a phosphor layer containing a phosphor and an adhesive layer laminated on one surface in the thickness direction of the phosphor layer, and the adhesive layer is formed of a silicone resin composition having both thermoplastic and thermosetting properties.

In the light emitting diode device, the adhesive layer is adhered to one surface in the thickness direction of the light emitting diode package, so that the adhesive force of the phosphor layer with respect to the light emitting diode package is improved.

Additionally, the adhesive layer is formed to be thin by the plasticization, so that light emitted from the light emitting diode element can be prevented from being diffused to the outside via the adhesive layer formed on one surface in the thickness direction of the reflector. Therefore, the luminous efficiency of the light emitting diode device can be improved.

In addition, the heat generated by wavelength conversion in the phosphor layer can be conducted to the reflector and the board via the adhesive layer formed to be thin, so that an efficient diffusion of the heat can be achieved. Therefore, the luminous efficiency of the light emitting diode device can be further improved.

Furthermore, a corroding component infiltrating into the light emitting diode package can be prevented from infiltrating thereto via the adhesive layer formed to be thin.

Also, the adhesive layer is cured by heating, so that the durability of the light emitting diode device can be improved.

As a result, the reliability of the light emitting diode device can be improved.

A light emitting diode device of the present invention includes a board, a light emitting diode element mounted on the board, and a phosphor adhesive sheet adhered to at least one surface in a thickness direction of the light emitting diode element, wherein the phosphor adhesive sheet includes a phosphor layer containing a phosphor and an adhesive layer laminated on one surface in the thickness direction of the phosphor layer, and the adhesive layer is formed of a silicone resin composition having both thermoplastic and thermosetting properties.

In the light emitting diode device, the adhesive layer is adhered to one surface in the thickness direction of the light emitting diode device, so that the adhesive force of the phosphor layer with respect to the light emitting diode package is improved.

Additionally, the adhesive layer is formed to be thin by the plasticization, so that the heat generated from the light emitting diode element can be efficiently conducted to the phosphor layer via the adhesive layer and therefore, the efficient diffusion of the heat can be achieved. Thus, the luminous efficiency of the light emitting diode device can be further improved.

Furthermore, a corroding component infiltrating into the light emitting diode element can be prevented from infiltrating thereto via the adhesive layer formed to be thin.

Also, the adhesive layer is cured by heating, so that the durability of the light emitting diode device can be improved.

As a result, the reliability of the light emitting diode device can be improved.

The method for producing a light emitting diode device of the present invention includes the steps of disposing a reflector on one side in a thickness direction of a board so as to surround a light emitting diode element when projected in the thickness direction, along with mounting the light emitting diode element on the board, and thereafter, filling an encapsulating layer in the reflector so as to encapsulate the light emitting diode element to prepare a light emitting diode package; putting a phosphor adhesive sheet, which includes a phosphor layer containing a phosphor and an adhesive layer laminated on one surface in the thickness direction of the phosphor layer, on one surface in the thickness direction of the light emitting diode package such that the adhesive layer is in contact with the light emitting diode package; temporarily fixing the phosphor layer to one surface in the thickness direction of the light emitting diode package by plasticizing the adhesive layer; and adhering the phosphor layer to one surface in the thickness direction of the light emitting diode package by curing the adhesive layer by heating, wherein the adhesive layer is formed of a silicone resin composition having both thermoplastic and thermosetting properties.

In the method for producing the light emitting diode device, the phosphor adhesive sheet is put on one surface in the thickness direction of the light emitting diode package such that the adhesive layer is in contact with the light emitting diode package and the adhesive layer is plasticized, so that the phosphor layer is temporarily fixed to one surface in the thickness direction of the light emitting diode package.

Additionally, in the phosphor adhesive sheet, by the plasticization of the adhesive layer, a gap can be prevented from being generated between the phosphor layer and one surface in the thickness direction of the light emitting diode package or the adhesive layer can also conform to a concavity and convexity on one surface in the thickness direction of the light emitting diode package. Therefore, by the subsequent curing by heating of the adhesive layer, the phosphor layer can be surely adhered to the light emitting diode package.

Therefore, after the light emitting diode package having the phosphor layer temporarily fixed thereto is subjected to an optical test, thereafter, when the light emitting diode package is defective, the phosphor layer can be peeled off from the light emitting diode package judged as defective to be temporarily fixed (reworked) to another light emitting diode package. As a result, the yield rate of the phosphor layer can be improved to reduce the production cost.

In this method, the phosphor layer is adhered to the light emitting diode package by curing the adhesive layer by heating, so that the adhesive force of the phosphor layer with respect to the light emitting diode package can be improved.

The method for producing a light emitting diode device of the present invention includes the steps of putting a phosphor adhesive sheet, which includes a phosphor layer containing a phosphor and an adhesive layer laminated on one surface in a thickness direction of the phosphor layer, on at least one surface in the thickness direction of a light emitting diode element such that the adhesive layer is in contact with the light emitting diode element; temporarily fixing the phosphor layer to at least one surface in the thickness direction of the light emitting diode element by plasticizing the adhesive layer; and adhering the phosphor layer to at least one surface in the thickness direction of the light emitting diode element by curing the adhesive layer by heating, wherein the adhesive layer is formed of a silicone resin composition having both thermoplastic and thermosetting properties.

In the method for producing the light emitting diode device, the phosphor adhesive sheet is put on at least one surface in the thickness direction of the light emitting diode element such that the adhesive layer is in contact with the light emitting diode element and the adhesive layer is plasticized, so that the phosphor layer is temporarily fixed to at least one surface in the thickness direction of the light emitting diode element.

Additionally, in the phosphor adhesive sheet, by the plasticization of the adhesive layer, a gap can be prevented from being generated between the phosphor layer and one surface in the thickness direction of the light emitting diode element or the adhesive layer can also conform to a concavity and convexity on at least one surface in the thickness direction of the light emitting diode element. Therefore, by the subsequent curing by heating of the adhesive layer, the phosphor layer can be surely adhered to the light emitting diode element.

Therefore, after the light emitting diode element having the phosphor layer temporarily fixed thereto is subjected to an optical test, thereafter, when the light emitting diode element is defective, the phosphor layer can be peeled off from the light emitting diode element judged as defective by heating to be temporarily fixed (reworked) to another light emitting diode element. As a result, the yield rate of the phosphor layer can be improved to reduce the production cost.

In this method, the phosphor layer is adhered to the light emitting diode element by curing the adhesive layer by heating, so that the adhesive force of the phosphor layer with respect to the light emitting diode element can be improved.

In the method for producing the light emitting diode device of the present invention, it is preferable that a step of mounting the light emitting diode element on the board is further included and the putting step is performed after the mounting step.

In the method for producing the light emitting diode device of the present invention, it is preferable that a step of mounting the light emitting diode element on the board is further included and the mounting step is performed after the adhering step.

The method for producing a light emitting diode element including a phosphor layer includes the steps of putting a phosphor adhesive sheet, which includes a phosphor layer containing a phosphor and an adhesive layer laminated on one surface in a thickness direction of the phosphor layer, on at least one surface in the thickness direction of a light emitting diode element such that the adhesive layer is in contact with the light emitting diode element; temporarily fixing the phosphor layer to at least one surface in the thickness direction of the light emitting diode element by plasticizing the adhesive layer; and adhering the phosphor layer to at least one surface in the thickness direction of the light emitting diode element by curing the adhesive layer by heating, wherein the adhesive layer is formed of a silicone resin composition having both thermoplastic and thermosetting properties.

In the method for producing the light emitting diode element including a phosphor layer, the phosphor adhesive sheet is put on at least one surface in the thickness direction of the light emitting diode element such that the adhesive layer is in contact with the light emitting diode element and the adhesive layer is plasticized, so that the phosphor layer is temporarily fixed to at least one surface in the thickness direction of the light emitting diode element.

Additionally, in this method, by the plasticization of the adhesive layer, a gap can be prevented from being generated between the phosphor layer and at least one surface in the thickness direction of the light emitting diode element or the adhesive layer can also conform to a concavity and convexity on at least one surface in the thickness direction of the light emitting diode element. Therefore, by the subsequent curing by heating of the adhesive layer, the phosphor layer can be surely adhered to the light emitting diode element.

In this method, the phosphor layer is adhered to the light emitting diode element by curing the adhesive layer by heating, so that the adhesive force of the phosphor layer with respect to the light emitting diode element can be improved.

Accordingly, the adhesive force of the phosphor layer with respect to the light emitting diode element is improved by the adhesive layer, so that the light emitting diode element including a phosphor layer which has an excellent durability and improved reliability can be produced.

In the phosphor adhesive sheet of the present invention, the adhesive layer is plasticized by heating, so that the phosphor layer can be temporarily fixed to the object, and by the subsequent heating, the adhesive layer is cured by heating, so that the phosphor layer can be adhered to the object.

According to the method for producing the phosphor adhesive sheet of the present invention and the method for producing the light emitting diode element including a phosphor layer of the present invention, the adhesive layer can be easily and uniformly formed on one surface in the thickness direction of the phosphor layer, so that the phosphor adhesive sheet and the light emitting diode element including a phosphor layer can be produced with an excellent workability (handling ability).

In the light emitting diode device of the present invention and the light emitting diode element including a phosphor layer of the present invention, the adhesive force of the phosphor layer with respect to the light emitting diode package or the light emitting diode element is improved, so that the light emitting diode device and the light emitting diode element including a phosphor layer can have an excellent durability and the reliability thereof can be improved.

In the method for producing the light emitting diode device of the present invention and the method for producing the light emitting diode element including a phosphor layer of the present invention, the production cost can be reduced.

(a) illustrating a step of putting a phosphor layer on a hot plate, (b) illustrating a step of putting a silicone resin composition on the phosphor layer, and (c) illustrating a step of plasticizing the silicone resin composition.

Figure 3:
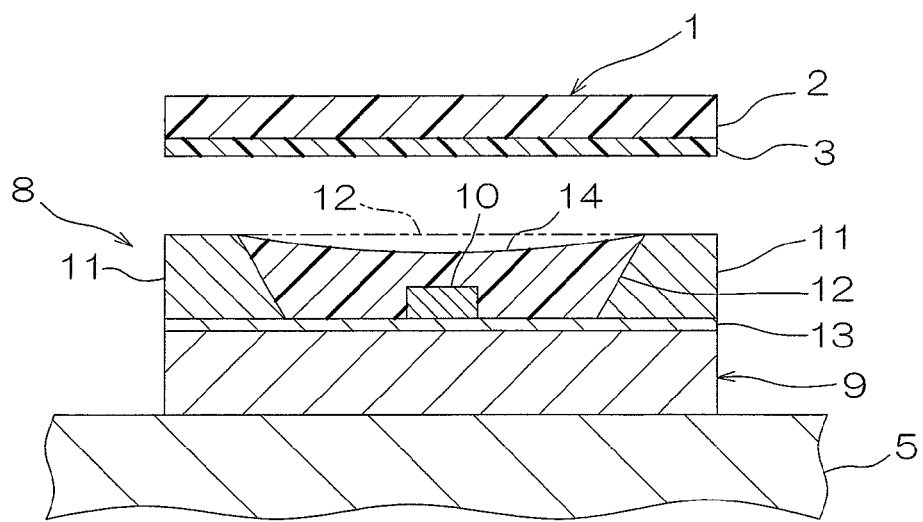
Figure 3:
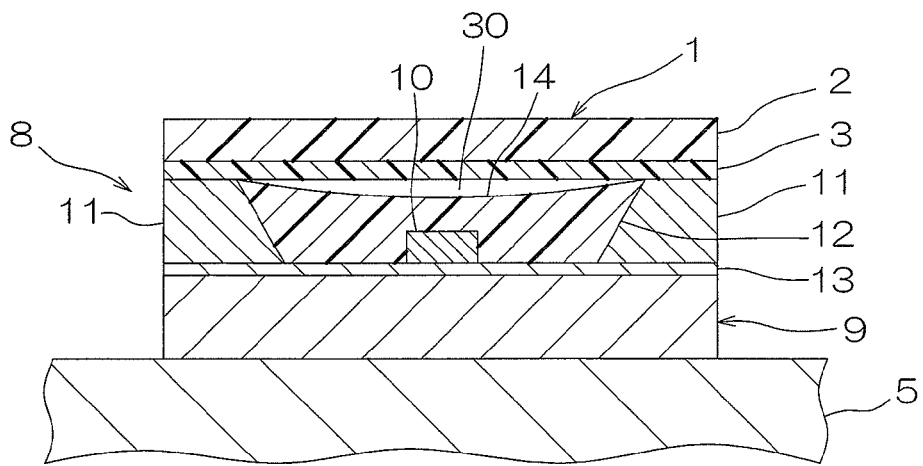
Figure 3:
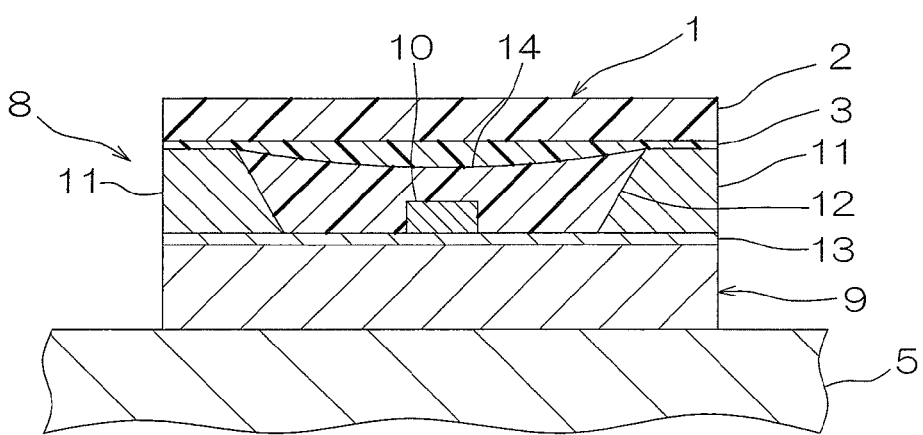

FIG. 3 shows sectional views for illustrating one embodiment of a method for producing a light emitting diode device of the present invention:

(a) illustrating a step of putting a light emitting diode package on the hot plate, (b) illustrating a step of putting the phosphor adhesive sheet on the light emitting diode package, and (c) illustrating a step of adhering the phosphor layer to the light emitting diode package.

Figure 4:
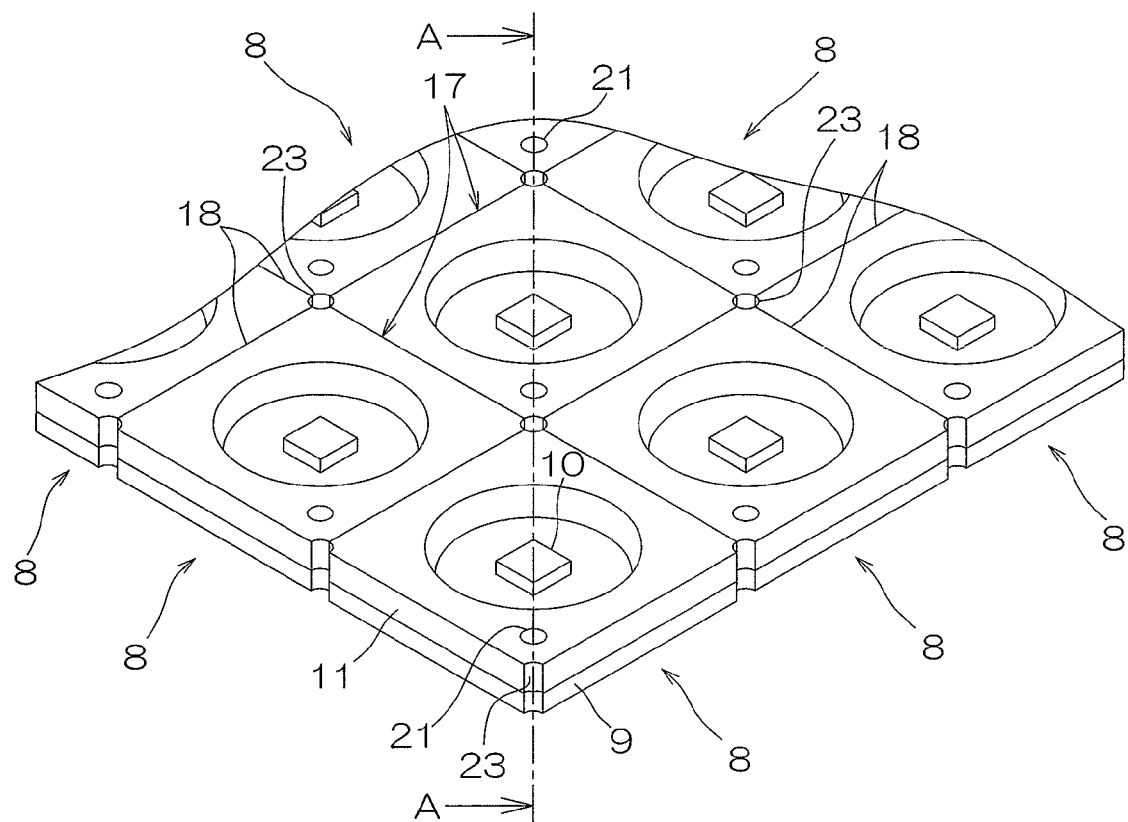

FIG. 4 shows a perspective view of a package assembly.

Figure 5:
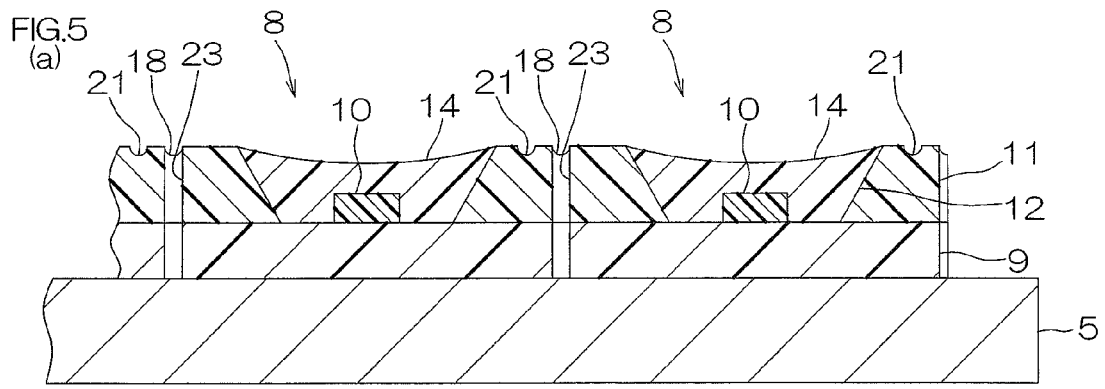
Figure 5:
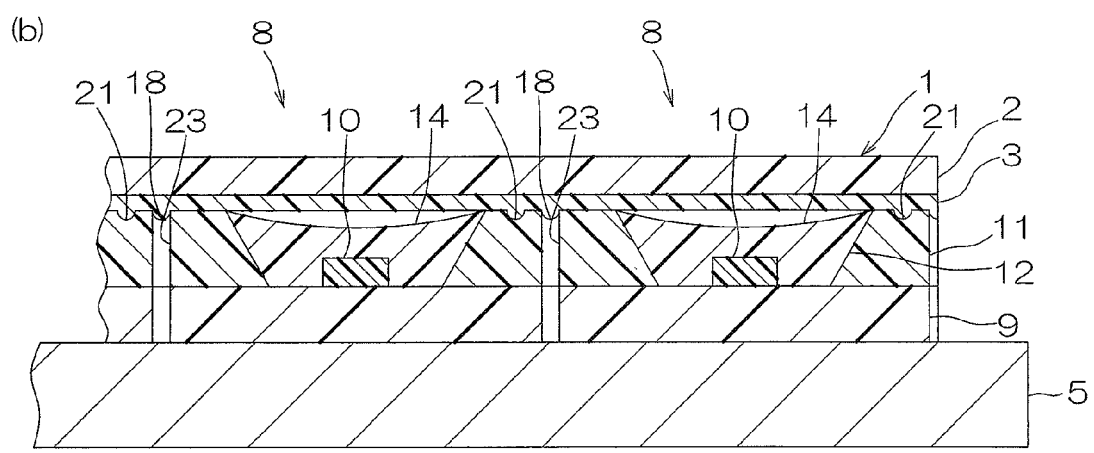
Figure 5:
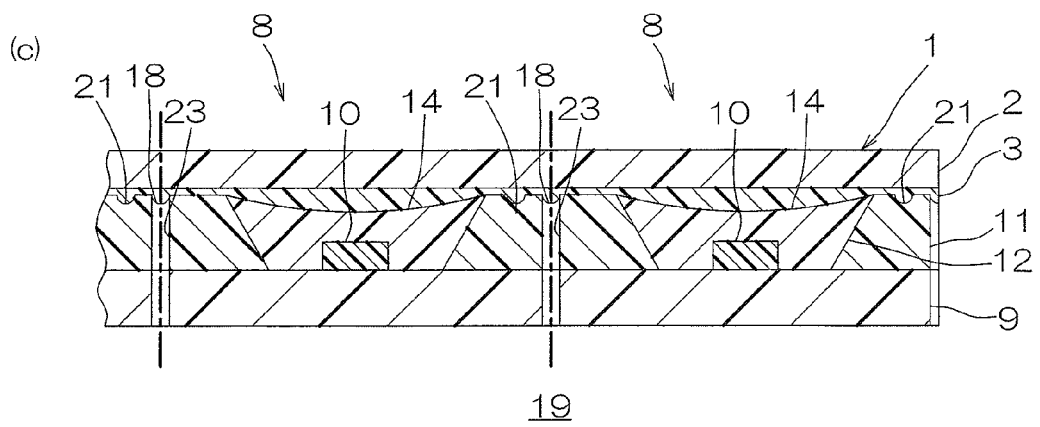

FIG. 5 shows sectional views for illustrating another embodiment (an embodiment in which the light emitting diode device is produced from the package assembly) of a method for producing the light emitting diode device of the present invention:

(a) illustrating a step of putting the light emitting diode package on the hot plate, (b) illustrating a step of putting the phosphor adhesive sheet on the light emitting diode package, and (c) illustrating a step of adhering the phosphor layer to the light emitting diode package.

Figure 6:
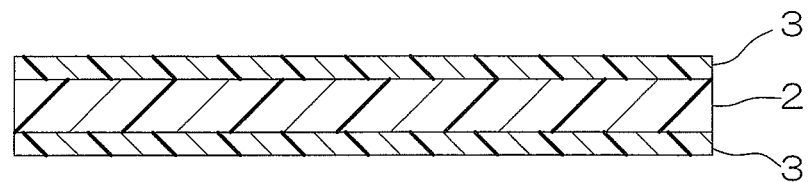

FIG. 6 shows a sectional view for illustrating another embodiment (an embodiment in which adhesive layers are provided on both surfaces of the phosphor layer) of the phosphor adhesive sheet of the present invention.

Figure 7:
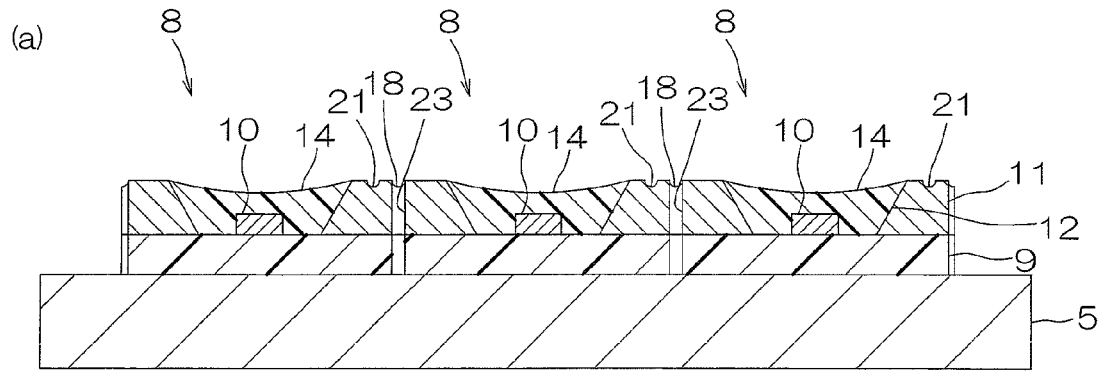
Figure 7:
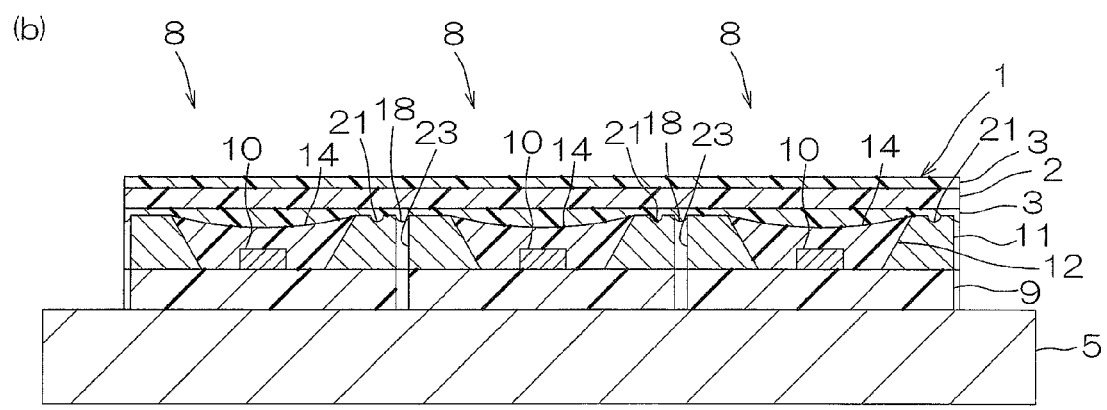
Figure 7:
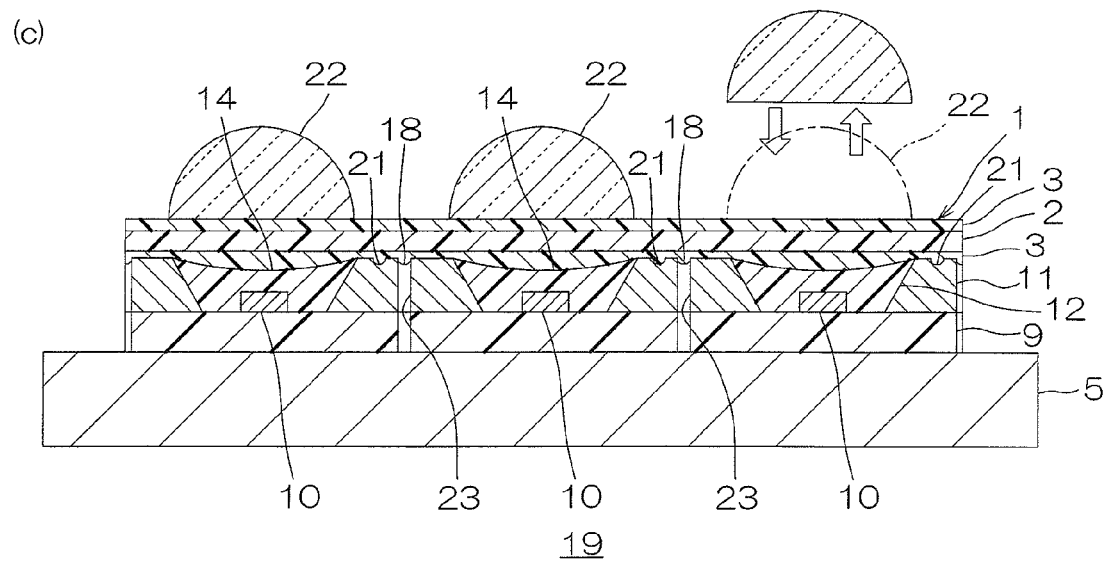

FIG. 7 shows sectional views for illustrating a method for producing the light emitting diode device by the phosphor adhesive sheet shown in FIG. 6:

(a) illustrating a step of putting the light emitting diode package on the hot plate, (b) illustrating a step of putting the phosphor adhesive sheet on the light emitting diode package, and (c) illustrating a step of putting and adhering a lens onto the phosphor adhesive sheet.

Figure 8:
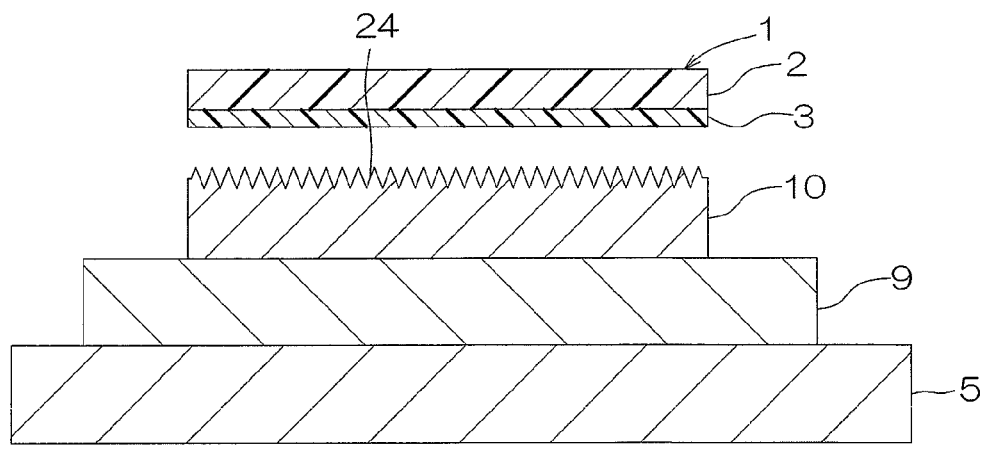
Figure 8:
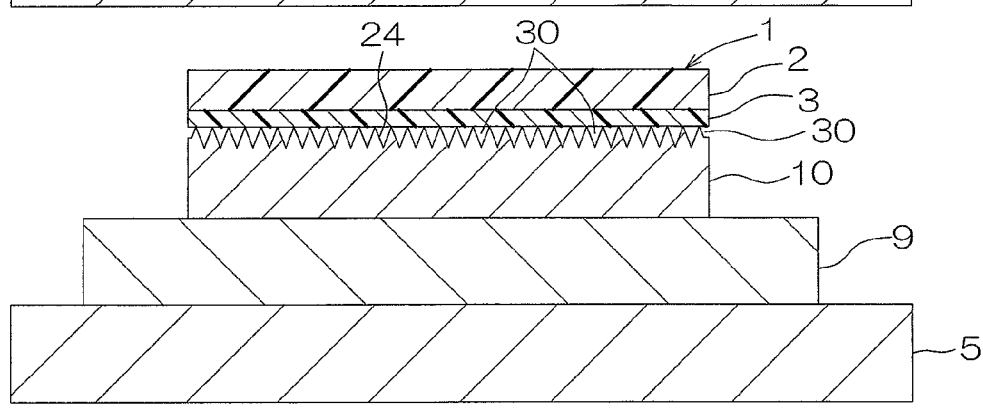
Figure 8:
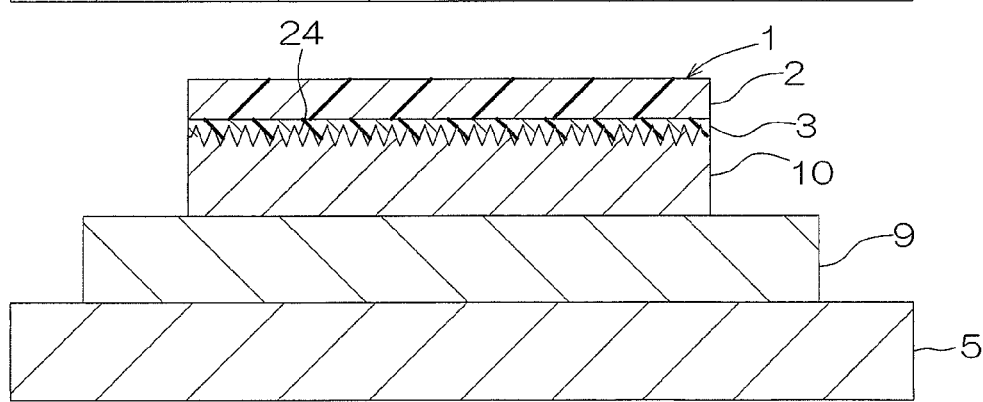
Figure 8:
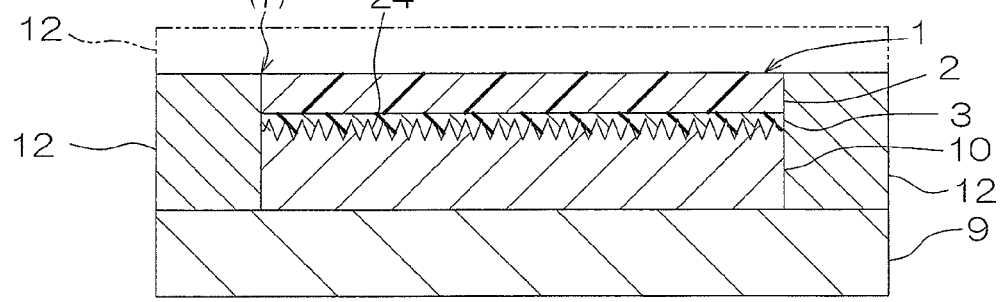

FIG. 8 shows sectional views for illustrating a method for producing another embodiment (an embodiment in which the phosphor adhesive sheet is laminated on the upper surface of a light emitting diode element) of the light emitting diode device of the present invention:

(a) illustrating a step of putting a board mounted with the light emitting diode element on the hot plate, (b) illustrating a step of putting the phosphor adhesive sheet on the light emitting diode element, (c) illustrating a step of allowing the adhesive layer to be plasticized and cured, and (d) illustrating a step of forming an encapsulating layer.

Figure 9:
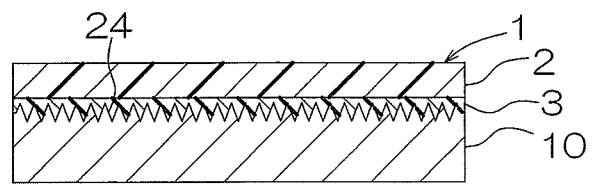
Figure 9:
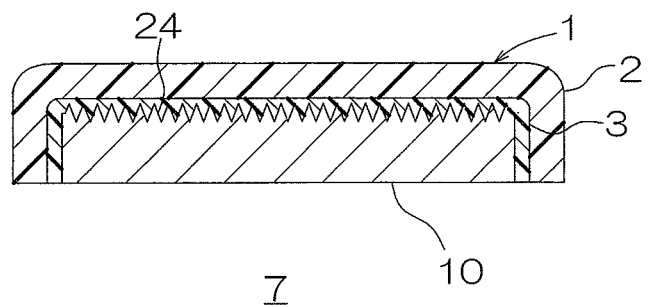

FIG. 9 shows sectional views for illustrating one embodiment of a light emitting diode element including a phosphor layer of the present invention:

(a) illustrating an embodiment of adhering the phosphor layer to the upper surface of the light emitting diode element and (b) illustrating an embodiment of adhering the phosphor layer to the upper surface and the side surfaces of the light emitting diode element.

Figure 10:
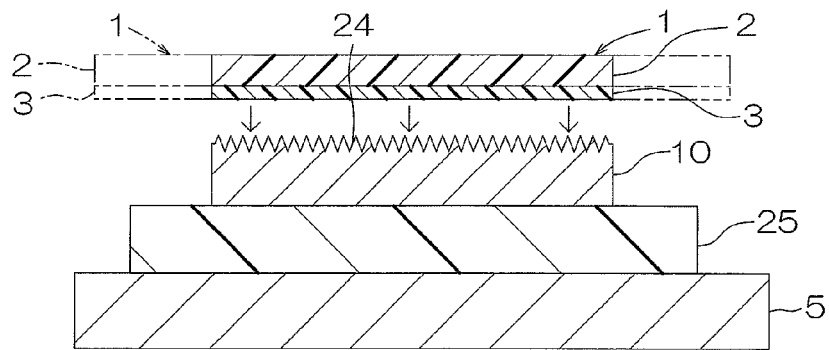
Figure 10:
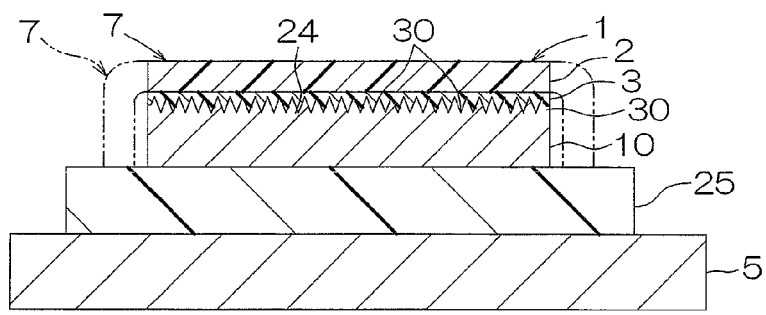
Figure 10:
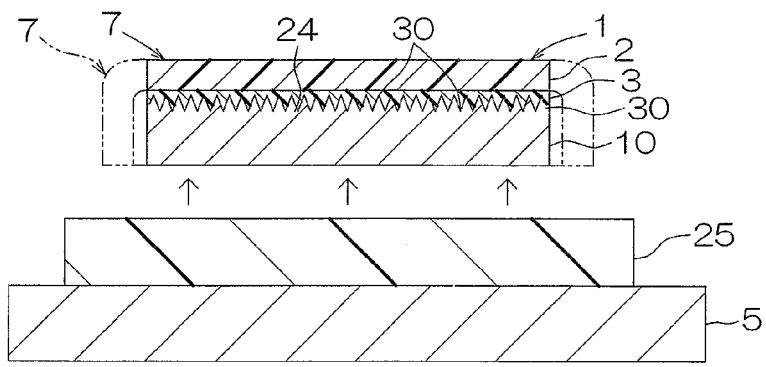
Figure 10:
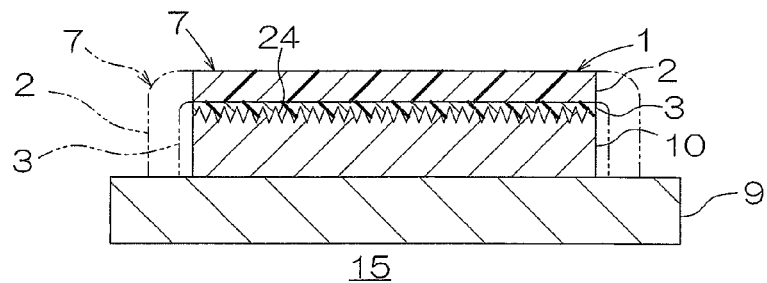
Figure 10:
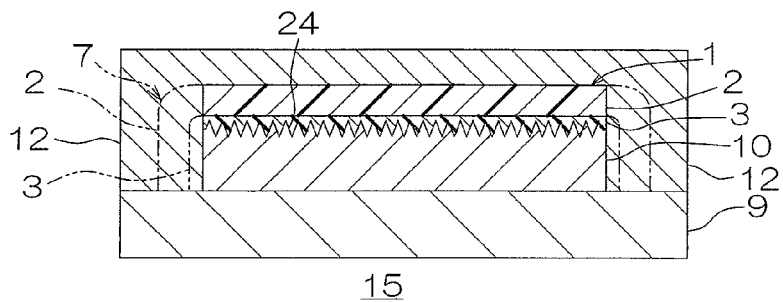

FIG. 10 shows sectional views for illustrating a method for producing the light emitting diode element including a phosphor layer in FIG. 9 and a method for producing the light emitting diode device using the light emitting diode element including a phosphor layer:

(a) illustrating a step of preparing the light emitting diode element supported by a support, (b) illustrating a step of adhering the phosphor adhesive sheet to the light emitting diode device, (c) illustrating a step of peeling off the light emitting diode element including a phosphor layer from a support, (d) illustrating a step of mounting the light emitting diode element including a phosphor layer on a board, and (e) illustrating a step of encapsulating the light emitting diode element including a phosphor layer by the encapsulating layer.

DETAILED DESCRIPTION OF THE INVENTION

Figure 1:
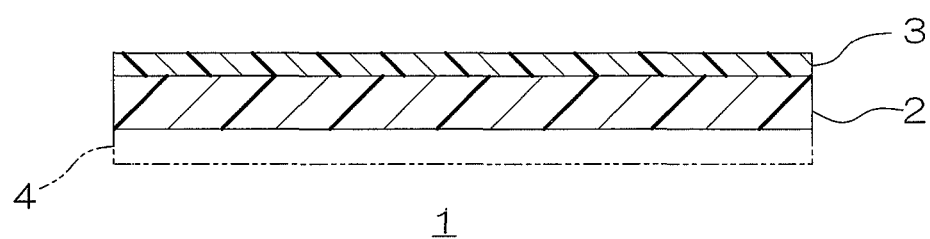
FIG. 1 shows a sectional view of one embodiment of a phosphor adhesive sheet of the present invention.
Figure 2:
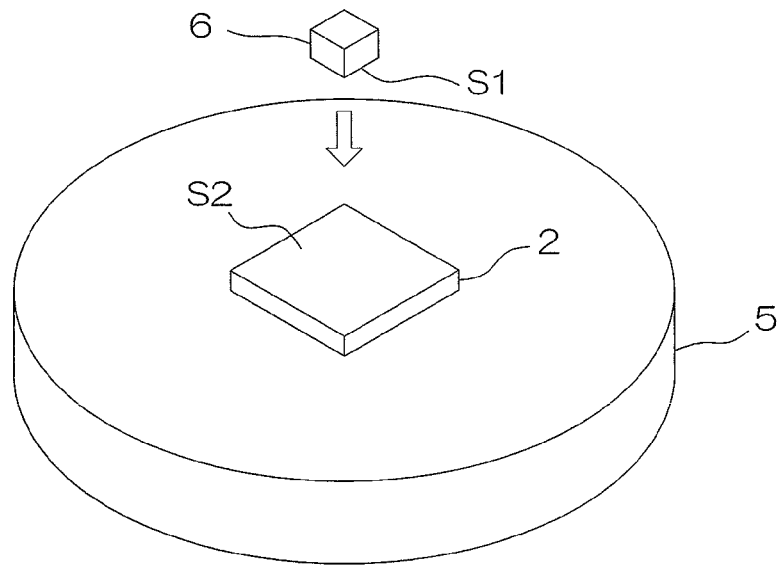
FIG. 2 shows perspective views for illustrating one embodiment of a method for producing the phosphor adhesive sheet of the present invention.
Figure 2:
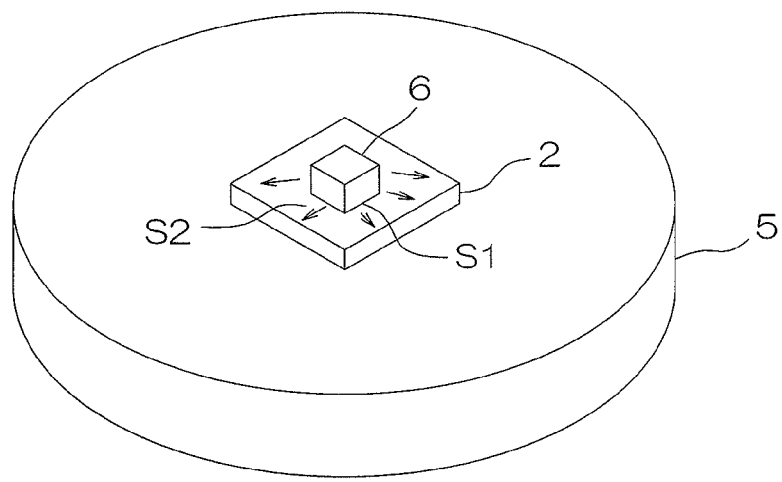
Figure 2:
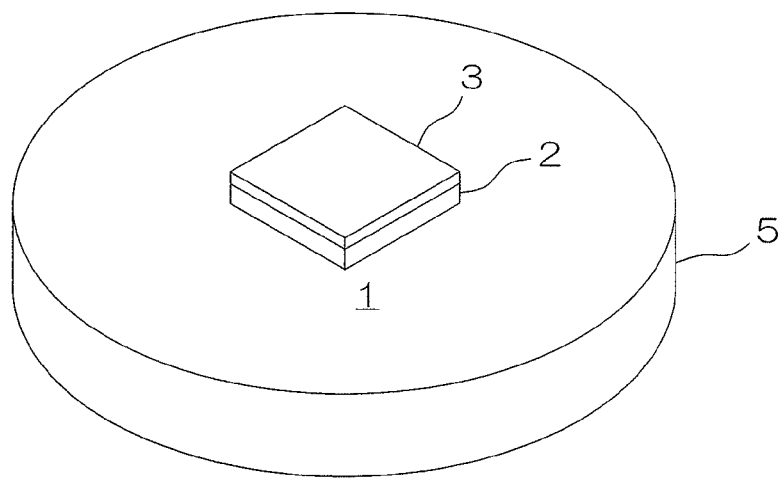

FIG. 1 shows a sectional view of one embodiment of a phosphor adhesive sheet of the present invention. FIG. 2 shows perspective views for illustrating one embodiment of a method for producing the phosphor adhesive sheet of the present invention. FIG. 3 shows sectional views for illustrating one embodiment of a method for producing a light emitting diode device of the present invention.

In FIG. 1, a phosphor adhesive sheet 1 includes a phosphor layer 2 and an adhesive layer 3 laminated on the upper surface (one surface in a thickness direction) of the phosphor layer 2.

The phosphor layer 2 is a wavelength conversion layer, which converts a part of blue light emitted from a light emitting diode element 10 to be described later (ref: FIG. 3) to yellow light and allows the remaining blue light to transmit therethrough. The phosphor layer 2 is formed into a plate shape or a sheet shape. The phosphor layer 2 is formed of, for example, a ceramic of a phosphor as a phosphor ceramic plate or is formed of a phosphor resin composition containing a phosphor and a resin as a phosphor resin sheet.

The phosphor emits fluorescent light, which is excited by absorbing a part or all of the light whose wavelength is in the range of 350 to 480 nm as an exciting light and has a wavelength longer than that of the exciting light, for example, in the range of 500 to 650 nm. To be specific, an example of the phosphor includes a yellow phosphor. An example thereof includes a phosphor obtained by doping a metal atom such as cerium (Ce) or europium (Eu) into a composite metal oxide, a metal sulfide, or the like.

To be specific, examples of the phosphor include a garnet type phosphor having a garnet type crystal structure such as $Y_3Al_5O_{12}$:Ce (YAG (yttrium aluminum garnet):Ce), $(Y, Gd)_3Al_5O_{12}$:Ce, $Tb_3Al_3O_{12}$:Ce, $Ca_3Sc_2Si_3O_{12}$:Ce, and $Lu_2CaMg_2(Si, Ge)_3O_{12}$:Ce; a silicate phosphor such as $(Sr, Ba)_2SiO_4$:Eu, $Ca_3SiO_4Cl_2$:Eu, $Sr_3SiO_5$:Eu, $Li_2SrSiO_4$:Eu, and $Ca_3Si_2O_7$:Eu; an aluminate phosphor such as $CaAl_{12}O_{19}$:Mn and $SrAl_2O_4$:Eu; a sulfide phosphor such as ZnS:Cu,Al, CaS:Eu, $CaGa_2S_4$:Eu, and $SrGa_2S_4$:Eu; an oxynitride phosphor such as $CaSi_2O_2N_2$:Eu, $SrSi_2O_2N_2$:Eu, $BaSi_2O_2N_2$:Eu, and Ca-α-SiAlON; a nitride phosphor such as $CaAlSiN_3$:Eu and $CaSi_5N_8$:Eu; and a fluoride-based phosphor such as $K_2SiF_6$:Mn and $K_2TiF_6$:Mn. Preferably, a garnet type phosphor is used, or more preferably, $Y_3Al_5O_{12}$:Ce (YAG) is used.

The phosphors can be used alone or in combination of two or more.

To form the phosphor layer 2 as a phosphor ceramic plate, the above-described phosphor is used as a ceramic material and by sintering the ceramic material, the phosphor layer 2 (phosphor ceramic) is obtained.

An additive can be added to the ceramic material at an appropriate ratio. Examples thereof include a binder resin, a dispersant, a plasticizer, and a sintering additive.

On the other hand, to form the phosphor layer 2 from the phosphor resin composition, first, the above-described phosphor is blended with the resin, so that the phosphor resin composition is prepared.

The resin is a matrix in which the phosphor is dispersed, including, for example, a transparent resin such as a silicone resin composition, an epoxy resin, and an acrylic resin. Preferably, in view of durability, a silicone resin composition is used.

The silicone resin composition has, in its molecule, a main chain mainly composed of the siloxane bond (—Si—O—Si—) and a side chain, which is bonded to silicon atoms (Si) of the main chain, and composed of an organic group such as an alkyl group (for example, a methyl group and the like) or an alkoxyl group (for example, a methoxy group).

To be specific, examples of the silicone resin composition include a dehydration condensation type silicone resin, an addition reaction type silicone resin, a peroxide curable silicone resin, a moisture curable silicone resin, and a curable silicone resin. Preferably, an addition reaction type silicone resin is used.

The silicone resin composition has a kinetic viscosity at 25° C. in the range of, for example, 10 to 30 mm$^2$/s.

The resins can be used alone or in combination of two or more.

The mixing ratio of each of the components is as follows. The mixing ratio of the phosphor is, for example, 1 to 50 mass %, or preferably 5 to 30 mass % with respect to the phosphor resin composition. The mixing ratio of the phosphor is, for example, 1 to 100 parts by mass, or preferably 5 to 40 parts by mass with respect to 100 parts by mass of the resin.

The mixing ratio of the resin is, for example, 50 to 99 mass %, or preferably 70 to 95 mass % with respect to the phosphor resin composition.

The phosphor and the resin are blended at the above-described mixing ratio to be stirred and mixed, so that the phosphor resin composition is prepared. The prepared phosphor resin composition is molded into a sheet shape and to be specific, is formed as a phosphor resin sheet.

The phosphor layer 2 has a thickness of, for example, 100 to 1000 µm when formed as a phosphor ceramic plate. The phosphor layer 2 has a thickness of, in view of film formability and appearance of device, for example, 25 to 1000 µm, or preferably 50 to 200 µm when formed of a phosphor resin sheet.

The adhesive layer 3 is formed on the entire upper surface (one surface in the thickness direction) of the phosphor layer 2.

The adhesive layer 3 is formed of a silicone resin composition having both thermoplastic and thermosetting properties.

Examples of the silicone resin composition include a first silicone resin composition, a second silicone resin composition, a third silicone resin composition, a fourth silicone resin composition, a fifth silicone resin composition, and a sixth silicone resin composition.

The first silicone resin composition contains, for example, a silicone resin composition containing amino groups at both ends, a diisocyanate, and a radical generator.

The silicone resin composition containing amino groups at both ends is, preferably, in view of transparency and high heat resistance, a compound represented by the following formula (1).

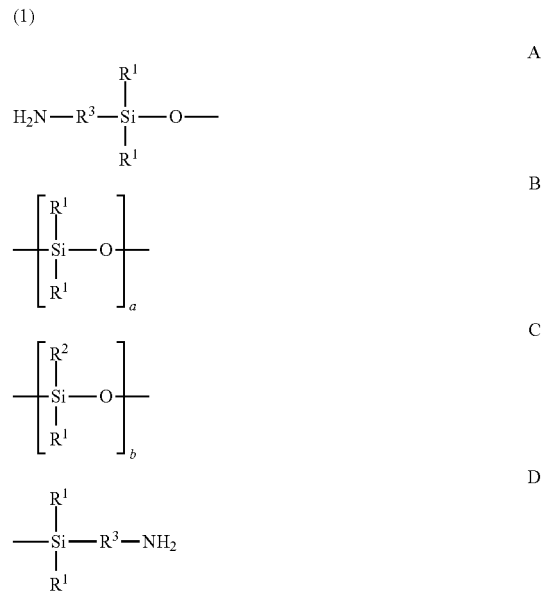

(where, in formula, A to D represent a constituent unit, A and D represent an end unit, and B and C represent a repeating unit. $R^1$ represents a monovalent hydrocarbon group, $R^2$ represents an alkenyl group, and $R^3$ represents an alkylene group. "a" represents an integer of 0 or 1 or more and "b" represents an integer of 0 or 1 or more. "a+b" satisfies the relationship of being an integer of at least 1 or more. All of the $R^1$'s may be the same or different from each other and "b" pieces of $R^2$ may be the same or different from each other.)

The compound represented by formula (1) consists of the constituent units A, B, C, and D and is a compound containing an amino group (—$NH_2$) in its end unit.

The hydrocarbon group represented by $R^1$ in formula (1) is, for example, a saturated hydrocarbon group or an aromatic hydrocarbon group. The number of carbon atoms in the hydrocarbon group is, in view of availability, for example, 1 to 20, or preferably 1 to 10.

An example of the saturated hydrocarbon group includes an alkyl group such as methyl, ethyl, propyl, butyl, pentyl, hexyl, cyclohexyl, and cyclopentyl. An example of the aromatic hydrocarbon group includes an aryl group such as phenyl, benzyl, and tolyl.

Of the hydrocarbon groups represented by $R^1$, in view of transparency and light resistance of the obtained first silicone resin composition, preferably, methyl and phenyl are used, or more preferably, methyl is used. In formula (1), preferably, all of the $R^1$'s are independent respectively, regardless of the constituent unit, and represent the above-described hydrocarbon group.

Examples of $R^2$ in formula (1) include a substituted or unsubstituted alkenyl group. To be specific, an organic group containing an alkenyl group in the skeleton is used. Examples thereof include vinyl, allyl, butyryl, pentynyl, and hexynyl. Among all, in view of transparency and heat resistance of the obtained first silicone resin composition, preferably, vinyl is used.

Examples of $R^3$ in formula (1) include a substituted or unsubstituted alkylene group. To be specific, an organic group containing an alkylene group in the skeleton is used. The number of carbon atoms in the organic group is, in view of transparency and heat resistance of the obtained first silicone resin composition, for example, 1 to 10. To be specific, examples thereof include methylene, ethylene, propylene, butylene, pentylene, hexylene, and heptylene. Among all, in view of transparency and heat resistance of the obtained first silicone resin composition, preferably, propylene is used. In formula (1), all of the $R^3$s, that is, two $R^3$s may be the same or different from each other.

The constituent unit A is an end unit and to be specific, is contained in one end of a molecule.

That is, one constituent unit A is contained in formula (1).

The constituent unit D is an end unit and to be specific, is contained in the other end of the molecule, which is the opposite side of the constituent unit A. That is, one constituent unit D is contained in formula (1).

The repeating unit number of the constituent unit B, that is, "a" in formula (1) represents an integer of 0 or 1 or more and is, in view of transparency of the obtained first silicone resin composition, for example, an integer of 1 to 10000, or preferably an integer of 10 to 10000.

The repeating unit number of the constituent unit C, that is, "b" in formula (1) is, in view of transparency of the obtained first silicone resin composition, for example, an integer of 0 to 10000, or preferably an integer of 0 to 1000.

The sum of "a" and "b" is preferably 1 to 10000, or more preferably 10 to 10000. The sum of "a" and "b" is an integer of at least 1 or more and therefore, either "a" or "b" may be 0.

A commercially available product can be used as the silicone resin composition containing amino groups at both ends represented by formula (1). The silicone resin composition containing amino groups at both ends can be also synthesized in accordance with a known method.

The weight average molecular weight of the silicone resin composition containing amino groups at both ends represented by formula (1) is, in view of stability and handling ability, for example, 100 to 1000000, or preferably 1000 to 100000. The weight average molecular weight is measured with a gel permeation chromatography (GPC: calibrated with standard polystyrene equivalent) and the same applies hereinafter.

The content of the silicone resin composition containing amino groups at both ends in the first silicone resin composition is, for example, 1 to 99.9 mass %, or preferably 80 to 99.9 mass %.

The diisocyanate is, in view of compatibility with each of the components, for example, represented by the following formula (2).

(where, in formula, Y represents a divalent hydrocarbon group.)

Examples of Y in formula (2) include a saturated or unsaturated straight chain, branched chain, or cyclic hydrocarbon group. The number of carbon atoms in the hydrocarbon group is, in view of availability and heat resistance of the obtained first silicone resin composition, for example, 1 to 50, or preferably 1 to 30.

Examples of the diisocyanate include aliphatic diisocyanate, aromatic diisocyanate, alicyclic diisocyanate, or modified forms thereof. To be specific, examples of the diisocyanate include hexamethylene diisocyanate, 4,4'-methylene dicyclohexylene diisocyanate, 4,4'-methylene diphenylene diisocyanate, 1,3-diazetidine-2,4-dione-bis(4,4'-methylene dicyclohexyl)diisocyanate, 1,3-diazetidine-2,4-dione-bis(4, 4-methylene diphenyl)diisocyanate, tetramethylene xylylene diisocyanate, isophorone diisocyanate, tolylene2,4-diisocyanate, and dicyclohexylmethylene diisocyanate. These can be used alone or in combination of two or more. Of these, in view of transparency, heat resistance, and availability, preferably, tolylene2,4-diisocyanate, isophorone diisocyanate, and hexamethylene diisocyanate are used.

A commercially available product can be used as the diisocyanate. The diisocyanate can be also synthesized in accordance with a known method.

The content of the diisocyanate in the first silicone resin composition is, for example, $1.0 \times 10^{-5}$ to 20 mass %, or preferably $1.0 \times 10^{-5}$ to 10 mass %.

In the mass ratio of the silicone resin composition containing amino groups at both ends to the diisocyanate, in view of allowing the amino group in the silicone resin composition containing amino groups at both ends to react with the isocyanate group in the diisocyanate neither too much nor too little, the molar ratio (the amino group/the isocyanate group) of the functional groups is, for example, 0.1/1 to 1/0.1, or preferably substantially equal in amount (1/1).

The radical generator is a compound, which generates radical and accelerates a cross-linking reaction among the silicone resin compositions containing amino groups at both ends. Examples thereof include a photo radical generator and an organic peroxide. The first silicone resin composition shows thermoplastic properties/thermosetting properties according to the temperature. Therefore, preferably, an organic peroxide, which generates radical by heating, is used.

To be specific, examples of the radical generator include methyl ethyl ketone peroxide, cyclohexanone peroxide, methylcyclohexanone peroxide, acetylacetone peroxide, 1,1-di(t-hexylperoxy)-3,3,5-trimethylcyclohexane, 1,1-di(t-hexylperoxy)cyclohexane, 1,1-di(t-butylperoxy)-2-methylcyclohexane, 1,1-di(t-butylperoxy)cyclohexane, 2,2-di(t-butylperoxy)butane, 2,2-di(4,4-di-(butylperoxy)cyclohexyl) propane, p-menthane hydroperoxide, diisopropylbenzene hydroperoxide, 1,1,3,3-tetramethylbutyl hydroperoxide, cumene hydroperoxide, t-butyl hydroperoxide, dicumyl peroxide, 2,5-dimethyl-2,5-di(t-butylperoxy)hexane, t-butylcumyl peroxide, di-t-hexyl peroxide, di-t-butyl peroxide, diisobutyryl peroxide, di-n-octanoyl peroxide, dibenzoyl peroxide, di-n-propyl peroxydicarbonate, diisopropyl peroxydicarbonate, di(4-t-butylcyclohexyl)peroxycarbonate, t-hexyl peroxyneodecanoate, t-butyl peroxyneodecanoate, t-butyl peroxydiisobutyrate, t-butyl peroxyallylmonocarbonate, and t-butyl peroxybenzene. These can be used alone or in combination of two or more. Of these, in view of transparency, heat resistance, and availability, preferably, di-t-butyl peroxide, 2,5-dimethyl-2,5-di(t-butylperoxy)hexane, and t-butyl peroxybenzene are used.

The temperature at which these radical generators generate radical is not unconditionally determined and is, for example, 100° C. or more.

A commercially available product can be used as the radical generator. The radical generator can be also synthesized in accordance with a known method.

The content of the radical generator in the first silicone resin composition is, for example, $1.0 \times 10^{-6}$ to 20 mass %, or preferably $1.0 \times 10^{-6}$ to 10 mass %.

The content of the radical generator with respect to 100 mol % of $R^1$ group amount in the silicone resin composition containing amino groups at both ends is, in view of maintaining flexibility of the obtained first silicone resin composition, for example, 0.001 to 50 mol %, or preferably 0.01 to 10 mol %.

The first silicone resin composition can be prepared without any particular limitation as long as it contains the silicone resin composition containing amino groups at both ends, the diisocyanate, and the radical generator.

In the first silicone resin composition, reaction temperature and duration are appropriately selected according to the respective reaction mechanism of the reaction of the isocyanate group and the cross-linking reaction by the radical generator to proceed and terminate the reactions. In this way, preferably, components related to the reaction of the isocyanate group, that is, the silicone resin composition containing amino groups at both ends and the diisocyanate are mixed in advance and then, the radical generator is blended thereto.

The mixing of the components related to the reaction of the isocyanate group is performed by stirring the silicone resin composition containing amino groups at both ends and the diisocyanate, and an additive such as an organic solvent as required at, for example, 0 to 100° C., or preferably 10 to 60° C. for, for example, 0.1 to 40 hours.

The organic solvent is not particularly limited and in view of improving compatibility of each of the components, preferably, ketone such as methyl ethyl ketone is used.

By the above-described mixing, a part of the reaction of the amino group in the silicone resin composition containing amino groups at both ends with the isocyanate group in the diisocyanate may start. The degree of progress of the reaction can be checked by $^1$H-NMR measurement based on the degree of disappearance of the peak derived from the amino group.

Next, as a component related to the cross-linking reaction, the radical generator is mixed in a mixture of the components related to the reaction of the isocyanate group described above. In the first silicone resin composition, a cured product (a molded product) can be obtained by the occurrence of the cross-linking reaction on obtaining the cured product by performing two types of the reactions, that is, the reaction of the isocynate group and the cross-linking reaction by the radical generator. Therefore, the mixing method is not particularly limited as long as the radical generator is uniformly mixed into the mixture of the components related to the reaction of the isocyanate group described above.

To be specific, the radical generator is blended into the mixture of the silicone resin composition containing amino groups at both ends and the diisocyanate to be stirred and mixed. The mixing duration is not unconditionally determined according to the reaction temperature and the type and amount of the component subjected to the reaction and is, for example, 0.1 to 40 hours. In the obtained mixture (the reactant), a solvent or the like can be removed in accordance with a known method.

The first silicone resin composition obtained in this way is solid under normal temperature, shows a thermoplastic behavior at 40° C. or more, and furthermore, shows thermosetting properties at 50° C. or more.

To be specific, the thermoplastic temperature of the first silicone resin composition is preferably 40 to 200° C., or more preferably 80 to 150° C. The thermoplastic temperature is the temperature at which the first silicone resin composition shows thermoplastic properties. To be specific, the thermoplastic temperature is the temperature at which the first silicone resin composition in a solid state is softened by heating to be brought into a completely liquid state and is substantially the same as the softening temperature.

The thermosetting temperature of the first silicone resin composition is preferably 100 to 200° C., or more preferably 130 to 200° C. The thermosetting temperature is the temperature at which the first silicone resin composition shows thermosetting properties. To be specific, the thermosetting temperature is the temperature at which the first silicone resin composition in a liquid state is cured by heating to be brought into a completely solid state.

The second silicone resin composition contains, for example, a silicone resin composition containing amino groups at both ends, an organohydrogenpolysiloxane, a diisocyanate, and a hydrosilylation catalyst.

An example of the silicone resin composition containing amino groups at both ends in the second silicone resin composition includes the same silicone resin composition containing amino groups at both ends as that illustrated in the first silicone resin composition.

The content of the silicone resin composition containing amino groups at both ends in the second silicone resin composition is, for example, 1 to 99.5 mass %, or preferably 80 to 99.5 mass %.

The organohydrogenpolysiloxane is a polysiloxane containing a hydrosilyl group (—SiH). To be more specific, the organohydrogenpolysiloxane is in a straight chain and an example thereof includes a side-chain type organohydrogenpolysiloxane, which contains a hydrosilyl group in its side chain bonded to the main chain, and/or a dual-end type organohydrogenpolysiloxane, which contains hydrosilyl groups at both ends of a molecule.

The side-chain type organohydrogenpolysiloxane is, for example, represented by the following formula (3).

(3)

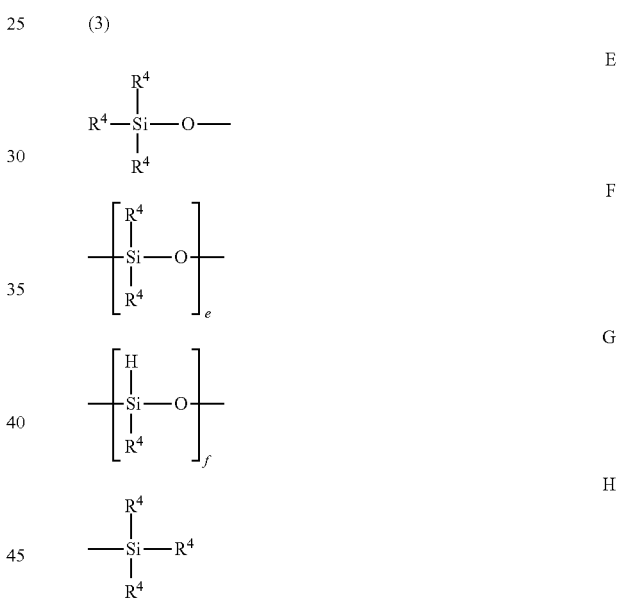

(where, in formula, E to H represent a constituent unit, E and H represent an end unit, and F and G represent a repeating unit. $R^4$ represents a monovalent hydrocarbon group. "e" represents an integer of 0 or 1 or more and "f" represents an integer of 1 or more.)

E to H constitute the side-chain type organohydrogenpolysiloxane.

The monovalent hydrocarbon group represented by $R^4$ in formula (3) may be the same or different from each other. Preferably, the monovalent hydrocarbon group represented by $R^4$ is the same.

An example of the monovalent hydrocarbon group represented by $R^4$ includes the same monovalent hydrocarbon group as that represented by $R^1$ in the above-described formulas (1) and (2). Preferably, methyl and phenyl are used, or more preferably, methyl is used.

"e" represents, in view of reactivity and stability, preferably an integer of 1 to 10000, or more preferably an integer of 1 to 5000.

"f" represents preferably an integer of 2 or more, and also represents, in view of reactivity and stability, preferably an integer of 1 to 10000, more preferably an integer of 1 to 1000, in view of imparting flexibility to the silicone resin composition while obtaining it in a solid state at room temperature, particularly preferably an integer larger than "e", or most preferably an integer of 100 to 1000.

Examples of the side-chain type organohydrogenpolysiloxane include methylhydrogensiloxane, dimethylsiloxane-co-methylhydrogensiloxane, ethylhydrogensiloxane, and methylhydrogensiloxane-co-methylphenylsiloxane.

The number average molecular weight of the side-chain type organohydrogenpolysiloxane is, in view of stability and handling ability, for example, 200 to 100000, or preferably 200 to 80000.

The side-chain type organohydrogenpolysiloxane can be, for example, synthesized in accordance with a known method. A commercially available product (for example, manufactured by Gelest, Inc., and Shin-Etsu Chemical Co., Ltd.) can also be used.

The dual-end type organohydrogenpolysiloxane is, for example, represented by the following formula (4).

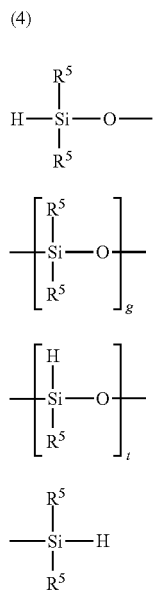

(where, in formula, R to U represent a constituent unit, R and U represent an end unit, and S and T represent a repeating unit. $R^5$ represents a monovalent hydrocarbon group selected from a saturated hydrocarbon group and an aromatic hydrocarbon group. "g" represents an integer of 0 or more and "t" represents an integer of 0 or more.)

R to U constitute the dual-end type organohydrogenpolysiloxane.

The monovalent hydrocarbon group represented by $R^5$ in formula (4) may be the same or different from each other. Preferably, the monovalent hydrocarbon group represented by $R^5$ is the same.

An example of the monovalent hydrocarbon group represented by $R^5$ includes the same monovalent hydrocarbon group as that represented by $R^1$ in the above-described formula (1). As the monovalent hydrocarbon group represented by $R^5$, preferably, a methyl group and a phenyl group are used, or more preferably, a methyl group is used.

"g" represents, in view of reactivity and stability, preferably an integer of 0 or more, more preferably an integer of 1 to 10000, or particularly preferably an integer of 1 to 5000.

"t" represents, in view of reactivity and stability, preferably an integer of 0 or more, more preferably an integer of 1 to 10000, or particularly preferably an integer of 1 to 5000.

The dual-end type organohydrogenpolysiloxane is, for example, when "t" is 1 or more, an organopolysiloxane containing both a hydrogen atom in its side chain and hydrogen atoms at both ends, which contains a hydrogen atom in the side chain branched off from the main chain and hydrogen atoms at both ends of the main chain. To be specific, examples thereof include methylhydrogenpolysiloxane containing hydrosilyl groups at both ends, (dimethylpolysiloxane-co-methylhydrogenpolysiloxane) containing hydrosilyl groups at both ends, ethylhydrogenpolysiloxane containing hydrosilyl groups at both ends, and (methylhydrogenpolysiloxane-co-methylphenylpolysiloxane) containing hydrosilyl groups at both ends.

The dual-end type organohydrogenpolysiloxane is, for example, when "t" is 0, an organopolysiloxane containing no hydrogen atom in its side chain/containing hydrogen atoms at both ends, which does not contain a hydrogen atom in the side chain branched off from the main chain and contains hydrogen atoms at both ends of the main chain. To be specific, examples thereof include polydimethylsiloxane containing hydrosilyl groups at both ends, polymethylphenylsiloxane containing hydrosilyl groups at both ends, and polydiphenylsiloxane containing hydrosilyl groups at both ends.

As the dual-end type organohydrogenpolysiloxane, preferably, an organopolysiloxane containing no hydrogen atom in its side chain/containing hydrogen atoms at both ends represented by formula (5) is used.

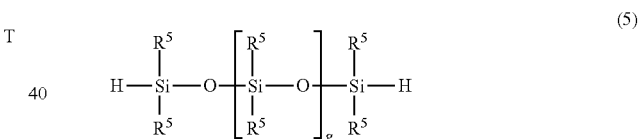

(where, in formula, $R^5$ represents a monovalent hydrocarbon group selected from a saturated hydrocarbon group and an aromatic hydrocarbon group. "g" represents an integer of 1 or more.)

The monovalent hydrocarbon group represented by $R^5$ in formula (5) may be the same or different from each other. Preferably, the monovalent hydrocarbon group represented by $R^5$ is the same.

In formula (5), $R^5$ is the same as the description above and "g" is the same as the description above.

The number average molecular weight of the dual-end type organohydrogenpolysiloxane is, in view of stability and handling ability, for example, 100 to 30000, or preferably 100 to 10000.

The dual-end type organohydrogenpolysiloxane can be, for example, synthesized in accordance with a known method. A commercially available product can also be used.

To be specific, the content of the hydrosilyl group in the organohydrogenpolysiloxane is, for example, 0.01 to 20 mmol/g, or preferably 0.05 to 15 mmol/g. The content of the hydrosilyl group is calculated from the integral value of the hydrosilyl group and the methyl group with a $^1$H-NMR.

The organohydrogenpolysiloxane can be, for example, synthesized in accordance with a known method. A commercially available product (for example, manufactured by Gelest, Inc., and Shin-Etsu Chemical Co., Ltd.) can also be used.

The content of the organohydrogenpolysiloxane in the second silicone resin composition is, for example, 0.0001 to 90 mass %, or preferably 0.001 to 50 mass %.

In the mass ratio of the silicone resin composition containing amino groups at both ends to the organohydrogenpolysiloxane, in view of allowing the alkenyl group in the silicone resin composition containing amino groups at both ends to react with the SiH group (the hydrosilyl group) in the organohydrogenpolysiloxane neither too much nor too little, the molar ratio (the alkenyl group/the SiH group) of the functional groups is, for example, 1/1 to 0.1/1, preferably 1/1 to 0.2/1, more preferably 1/1 to 0.5/1, or particularly preferably substantially equal in amount (1/1).

An example of the diisocyanate includes the same diisocyanate as that illustrated in the first silicone resin composition.

The content of the diisocyanate in the second silicone resin composition is, for example, $1.0 \times 10^{-5}$ to 20 mass %, or preferably $1.0 \times 10^{-5}$ to 10 mass %.

In the mass ratio of the silicone resin composition containing amino groups at both ends to the diisocyanate, in view of allowing the amino group in the silicone resin composition containing amino groups at both ends to react with the isocyanate group in the diisocyanate neither too much nor too little, the molar ratio (the amino group/the isocyanate group) of the functional groups is, for example, 1/1 to 0.1/1, preferably 1/1 to 0.2/1, more preferably 1/1 to 0.5/1, or particularly preferably substantially equal in amount (1/1).

The hydrosilylation catalyst is not particularly limited as long as it is a compound, which catalyzes the hydrosilylation reaction of the alkenyl group in the silicone resin composition containing amino groups at both ends with the hydrosilyl group in the organohydrogenpolysiloxane. Examples of the hydrosilylation catalyst include a platinum catalyst such as platinum black, platinum chloride, chloroplatinic acid, a platinum olefin complex, a platinum carbonyl complex, and platinum acetyl acetate; a palladium catalyst; and a rhodium catalyst.

In the content of the hydrosilylation catalyst in the second silicone resin composition, for example, when the platinum catalyst is used, in view of reaction speed, the content of the platinum is, for example, $1.0 \times 10^{-10}$ to 0.5 parts by mass, or preferably $1.0 \times 10^{-8}$ to $1.0 \times 10^{-3}$ parts by mass with respect to 100 parts by mass of the organohydrogenpolysiloxane.

The second silicone resin composition can be prepared without any particular limitation as long as it contains each of the components of the silicone resin composition containing amino groups at both ends, the organohydrogenpolysiloxane, the diisocyanate, and the hydrosilylation catalyst.

In the second silicone resin composition, reaction temperature and duration are appropriately selected according to the respective reaction mechanism of the reaction of the isocyanate group and the hydrosilylation reaction to proceed and terminate the reactions. In this way, components related to the reaction of the isocyanate group are mixed in advance and then, the components related to the hydrosilylation reaction may be mixed thereto.

The mixing of the components related to the reaction of the isocyanate group can be performed by stirring the silicone resin composition containing amino groups at both ends and the diisocyanate, and an additive such as an organic solvent as required at, for example, 0 to 100° C., or preferably 10 to 60° C. for, for example, 0.1 to 40 hours.

The organic solvent is not particularly limited and in view of improving compatibility of each of the components, preferably, ketone such as methyl ethyl ketone is used.

By the above-described mixing, a part of the reaction of the amino group in the silicone resin composition containing amino groups at both ends with the isocyanate group in the diisocyanate may start. The degree of progress of the reaction can be checked by $^1$H-NMR measurement based on the degree of disappearance of the peak derived from the amino group.

Thereafter, as components related to the hydrosilylation reaction, the organohydrogenpolysiloxane and the hydrosilylation catalyst are blended in a mixture of the components related to the reaction of the isocyanate group described above.

In the second silicone resin composition, by the subsequent heating, a cured product (a molded product) can be obtained by the occurrence of the above-described hydrosilylation reaction. Therefore, the mixing method is not particularly limited as long as the components related to the hydrosilylation reaction are uniformly mixed into the mixture of the components related to the reaction of the isocyanate group described above.

To be specific, the organohydrogenpolysiloxane and the hydrosilylation catalyst are blended into the mixture of the silicone resin composition containing amino groups at both ends and the diisocyanate to be stirred and mixed. The mixing duration is not unconditionally determined according to the reaction temperature and the type and amount of the component subjected to the reaction and is, for example, 0.1 to 40 hours. The mixing method is not particularly limited as long as each of the components is uniformly mixed. In the obtained mixture, a solvent or the like can be removed in accordance with a known method.

The second silicone resin composition obtained in this way is solid under normal temperature, shows a thermoplastic behavior at 40° C. or more, and furthermore, shows thermosetting properties at 50° C. or more.

To be specific, the thermoplastic temperature of the second silicone resin composition is, for example, 40 to 200° C., or preferably 40 to 150° C.

In the following thermosetting temperature, in the second silicone resin composition, the hydrosilylation reaction proceeds and the second silicone resin composition is cured by heating.

The thermosetting temperature is, for example, 100 to 200° C., or preferably 130 to 200° C. The degree of progress of the hydrosilylation reaction can be checked by $^1$H-NMR measurement based on the intensity of a signal derived from the amino group in the silicone resin composition containing amino groups at both ends. The reaction is considered to be terminated at the time of disappearance of the signal.

The third silicone resin composition is obtained by allowing a cage octasilsesquioxane to react with an alkenyl group-containing polysiloxane in the presence of a hydrosilylation catalyst.

The cage octasilsesquioxane is an octamer of trifunctional silicone monomer and to be specific, has eight groups represented by the following formula (6),

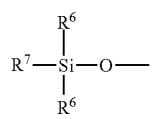

(6)

(where, in formula, $R^6$ represents a monovalent hydrocarbon group and $R^7$ represents hydrogen or a monovalent hydrocarbon group. The molar ratio of the monovalent hydrocarbon group: hydrogen in $R^7$ in the cage octasilsesquioxane as a whole is, as an average value, in the range of 6.5:1.5 to 5.5:2.5.)

To be more specific, the cage octasilsesquioxane is represented by the following formula (7).

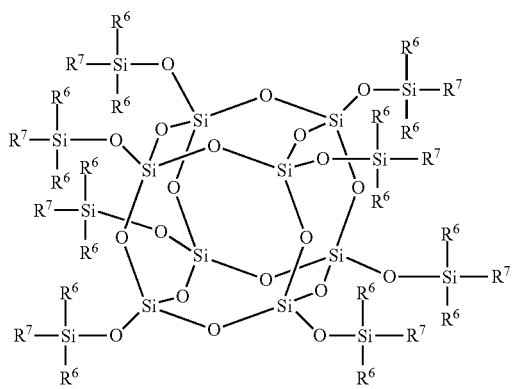 (7)

(where, in formula, $R^6$ and $R^7$ are the same as the description above. The molar ratio of the monovalent hydrocarbon group: hydrogen in $R^7$ is the same as the description above.)

An example of the monovalent hydrocarbon group represented by $R^6$ in the above-described formulas (6) and (7) includes a saturated hydrocarbon group or an aromatic hydrocarbon group.

Examples of the saturated hydrocarbon group include a straight chain saturated hydrocarbon group (for example, an alkyl group having 1 to 6 carbon atoms such as methyl, ethyl, propyl, butyl, pentyl, and hexyl), a branched chain saturated hydrocarbon group (for example, an alkyl group having 3 to 6 carbon atoms such as isopropyl and isobutyl), and a cyclic saturated hydrocarbon group (for example, a cycloalkyl group having 3 to 6 carbon atoms such as cyclohexyl).

An example of the aromatic hydrocarbon group includes an aryl group having 6 to 8 carbon atoms such as phenyl, benzyl, and tolyl.

The number of carbon atoms of the monovalent hydrocarbon group is, for example, 1 to 8, or preferably 1 to 6.

$R^6$ may be the same or different from each other. Preferably, $R^6$ is the same.

As the monovalent hydrocarbon group, preferably, in view of easy preparation and thermal stability, a saturated and straight chain hydrocarbon group is used, more preferably, an alkyl group having 1 to 6 carbon atoms is used, or particularly preferably, methyl is used.

An example of the monovalent hydrocarbon group represented by $R^7$ in the above-described formulas (6) and (7) includes the same monovalent hydrocarbon group as that represented by $R^1$ described above. Preferably, methyl is used.

The molar ratio of the monovalent hydrocarbon group: hydrogen in $R^7$ in formula (7), the cage octasilsesquioxane as a whole, is in the range of 6.5:1.5 to 5.5:2.5, or preferably 6.0:2.0 to 5.5:2.5 as an average value.

That is, in one molecule of the cage octasilsesquioxane, the group represented by the above-described formula (6) forms 1.5 to 2.5 (to be specific, two), or preferably 2 to 2.5 (to be specific, two) of the hydrosilyl groups (—SiH).

When the above-described molar ratio of the monovalent hydrocarbon group: hydrogen in $R^7$ exceeds 6.5/1.5 (=6.5:

1.5) (for example, 7/1 (=7:1)), the number of moles of the hydrosilyl group is significantly small and therefore, the reactivity of the cage octasilsesquioxane with respect to the alkenyl group-containing polysiloxane is significantly reduced. Thus, the molecular weight of the third silicone resin composition to be obtained is decreased and a solid silicone resin composition may not be obtained.

On the other hand, when the above-described molar ratio of the monovalent hydrocarbon group: hydrogen in $R^7$ is below 5.5/2.5 (=5.5:2.5) (for example, 5/3 (=5:3)), the number of moles of the hydrosilyl group in the cage octasilsesquioxane is significantly large and therefore, the reactivity of the cage octasilsesquioxane with respect to the alkenyl group-containing polysiloxane significantly increases. Thus, the third silicone resin composition may not show thermoplastic properties.

To be specific, examples of the above-described cage octasilsesquioxane include a cage octasilsesquioxane having methyl in $R^6$ and methyl or hydrogen in $R^7$ in the above-described formulas (6) and (7) and having a molar ratio of methyl: hydrogen in $R^7$ in the cage octasilsesquioxane as a whole of 5.5:2.5, 6:2, or 6.5:1.5 as an average value.

The cage octasilsesquioxane represented by the above-described formula (7) is, for example, synthesized in accordance with a known method (for example, in accordance with the description in Japanese Unexamined Patent Publication No. 2007-246880).

To be specific, tetraalkoxysilane (tetraethoxysilane and the like) is allowed to react with an alcohol such as methanol and/or with water in the presence of a catalyst to synthesize an octa (silsesquioxane) skeleton (a portion in formula (7) excluding the groups of formula (6)) and thereafter, dialkylchlorosilane (dimethylchlorosilane and the like) and trialkylchlorosilane (trimethylchlorosilane and the like) are blended at a mixing ratio corresponding to the molar ratio of the monovalent hydrocarbon group: hydrogen in the above-described $R^7$. Then, an alkoxyl group (ethoxy and the like) bonded to the silicon atom of the octa (silsesquioxane) skeleton is allowed to react with dialkylchlorosilane and trialkylchlorosilane. After the reaction, the reactant is refined as required. In this way, the cage octasilsesquioxane can be obtained.

A commercially available product can also be used as the cage octasilsesquioxane.

The alkenyl group-containing polysiloxane is a polysiloxane containing alkenyl groups at both ends, which contains alkenyl groups at both ends of the molecule.

To be specific, the alkenyl group-containing polysiloxane is represented by the following formula (8).

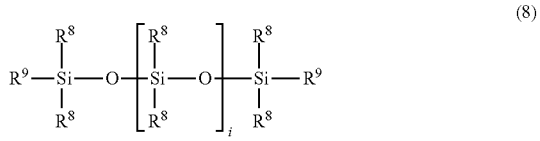 (8)

(where, in formula, $R^8$ represents a monovalent hydrocarbon group and $R^9$ represents an alkenyl group. "i" represents an integer of 1 or more.)

The monovalent hydrocarbon group represented by $R^8$ in formula (8) may be the same or different from each other. Preferably, the monovalent hydrocarbon group represented by $R^8$ is the same.

An example of the monovalent hydrocarbon group represented by $R^8$ includes the same monovalent hydrocarbon group as that represented by $R^6$ in the above-described formulas (6) and (7). Preferably, methyl and phenyl are used, or more preferably, methyl is used.

Examples of the alkenyl group represented by $R^9$ in formula (8) include a substituted or unsubstituted alkenyl group. Preferably, an unsubstituted alkenyl group is used.

An example of the alkenyl group includes an alkenyl group having 2 to 10 carbon atoms such as vinyl, allyl, propenyl, butenyl, and pentenyl.

The number of carbon atoms of the alkenyl group is, for example, 2 to 10, or preferably 2 to 5.

$R^9$ may be the same or different from each other. Preferably, $R^9$ is the same.

As the alkenyl group, preferably, in view of reactivity with the hydrosilyl group in the cage octasilsesquioxane, an alkenyl group having 2 to 5 carbon atoms is used, or more preferably, vinyl is used.

"i" represents, in view of reactivity and stability, preferably an integer of 1 to 5000, or more preferably an integer of 1 to 1000.

The number average molecular weight of the alkenyl group-containing polysiloxane represented by the above-described formula (8) is, in view of safety and handling ability, for example, 100 to 10000, or preferably 300 to 5000.

The alkenyl group-containing polysiloxane represented by the above-described formula (8) can be, for example, synthesized in accordance with a known method. A commercially available product (for example, manufactured by Gelest, Inc.) can also be used.

An example of the hydrosilylation catalyst includes the same hydrosilylation catalyst as that illustrated in the second silicone resin composition. As the hydrosilylation catalyst, preferably, in view of compatibility and transparency, a platinum catalyst is used, or more preferably, a platinum olefin complex is used. To be specific, a platinum-divinylsiloxane complex such as a platinum-1,3-diving-1,1,3,3-tetramethyl-disiloxane complex is used.

The hydrosilylation catalyst may be prepared as a solution in a known solvent (such as toluene).

The mixing ratio of the hydrosilylation catalyst (solid content) is, for example, $1.0 \times 10^{-10}$ to 3 parts by mass, or preferably $1.0 \times 10^{-8}$ to 1 parts by mass with respect to 100 parts by mass of the total amount of the cage octasilsesquioxane and the alkenyl group-containing polysiloxane.

The cage octasilsesquioxane is allowed to react with the alkenyl group-containing polysiloxane in the presence of the hydrosilylation catalyst such that the number of moles of the hydrosilyl group in the cage octasilsesquioxane is larger (excessive) than that of the alkenyl group in the alkenyl group-containing polysiloxane.

The molar ratio (the number of moles of the alkenyl group/the number of moles of the hydrosilyl group) of the alkenyl group to the hydrosilyl group is below 1, for example, 0.10 to 0.99, preferably 0.20 to 0.99, or more preferably 0.50 to 0.99.

On the other hand, when the above-described molar ratio exceeds the above-described range, the hydrosilyl group is fewer than the alkenyl group. In such a case, the excess of the hydrosilyl group does not remain after the reaction and thermosetting properties may not be imparted to the third silicone resin composition.

To allow the above-described cage octasilsesquioxane to react with the above-described alkenyl group-containing polysiloxane, they are blended at the above-described mixing ratio, along with the hydrosilylation catalyst and the solvent, and thereafter, the mixture is heated as required.

Examples of the solvent include an aromatic hydrocarbon such as toluene, an aliphatic hydrocarbon such as hexane, and ester such as ethyl acetate. Preferably, in view of improving compatibility of each of the components, an aromatic hydrocarbon is used, or more preferably, toluene is used.

The reaction temperature is, for example, 0 to 100° C., or preferably 20 to 80° C. and the reaction duration is, for example, 0.5 to 96 hours.

In this way, the hydrosilyl group in the cage octasilsesquioxane and the alkenyl group in the alkenyl group-containing polysiloxane are allowed to undergo the hydrosilylation reaction.

The degree of the hydrosilylation reaction can be checked by $^1$H-NMR measurement based on the intensity of a signal derived from the alkenyl group in the alkenyl group-containing polysiloxane. The hydrosilylation reaction is considered to be terminated at the time of disappearance of the signal.

In the above-described hydrosilylation reaction, the cage octasilsesquioxane is allowed to react with the alkenyl group-containing polysiloxane such that the number of moles of the hydrosilyl group is excessive compared with the number of moles of the alkenyl group. Therefore, after the reaction, the excess of the hydrosilyl group remains and the excess of the hydrosilyl group is hydrolyzed with moisture in the air and undergoes a condensation reaction by the subsequent heating (for example, the heating at 100 to 200° C.). The excess of the hydrosilyl group is bonded with each other (three-dimensional cross-linking) and in this way, thermosetting properties are imparted to the third silicone resin composition.

In this way, the third silicone resin composition can be obtained.

The obtained third silicone resin composition is in a solid state. The third silicone resin composition in a solid state is obtained because the mobility of the alkenyl group-containing polysiloxane is decreased due to the steric hindrance of the cage octasilsesquioxane.

The thermoplastic temperature of the third silicone resin composition is, for example, 40 to 100° C., or preferably 50 to 90° C.

The thermosetting properties of the once plasticized third silicone resin composition are exhibited by hydrolysis and condensation reaction of the excess of the hydrosilyl group by the subsequent heating, causing the excess of the hydrosilyl group to bond with each other (three-dimensional cross-linking)

The thermosetting temperature of the third silicone resin composition is, for example, 150 to 300° C., or preferably 180 to 250° C.

The fourth silicone resin composition contains a cage octasilsesquioxane, an alkenyl group-containing polysiloxane, a hydrosilylation catalyst, and a hydroxyl group-containing polysiloxane.

Each example of the cage octasilsesquioxane, the alkenyl group-containing polysiloxane, and the hydrosilylation catalyst in the fourth silicone resin composition includes the same cage octasilsesquioxane as that illustrated in the third silicone resin composition, the same alkenyl group-containing polysiloxane as that illustrated in the third silicone resin composition, and the same hydrosilylation catalyst as that illustrated in the second silicone resin composition, respectively.

The hydroxyl group-containing polysiloxane is a polysiloxane containing a plurality (for example, two) of hydroxyl groups. To be more specific, the hydroxyl group-containing polysiloxane is a dual-end type polysiloxane containing hydroxyl groups at both ends of the molecule. To be more specific, the hydroxyl group-containing polysiloxane is represented by the following formula (9).

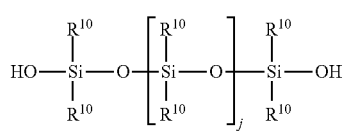 (9)

(where, in formula, $R^{10}$ represents a monovalent hydrocarbon group. "j" represents an integer of 1 or more.)

The monovalent hydrocarbon group represented by $R^{10}$ in formula (9) may be the same or different from each other. Preferably, the monovalent hydrocarbon group represented by $R^{10}$ is the same.

An example of the monovalent hydrocarbon group represented by $R^{10}$ includes the same monovalent hydrocarbon group as that represented by $R^6$ in the above-described formulas (5) and (6). Preferably, methyl and phenyl are used, or more preferably, methyl is used.

"j" represents, in view of reactivity and stability, preferably an integer of 1 to 10000, or more preferably an integer of 1 to 5000.

The number average molecular weight of the hydroxyl group-containing polysiloxane represented by the above-described formula (9) is, in view of safety and handling ability, for example, 100 to 100000, or preferably 500 to 50000.

The hydroxyl group-containing polysiloxane represented by the above-described formula (9) can be, for example, synthesized in accordance with a known method. A commercially available product (for example, manufactured by Gelest, Inc.) can also be used.

The cage octasilsesquioxane, the alkenyl group-containing polysiloxane, the hydrosilylation catalyst, and the hydroxyl group-containing polysiloxane are blended to prepare the fourth silicone resin composition.

The mixing ratio of the cage octasilsesquioxane is, for example, 1 to 50 mass %, or preferably 5 to 40 mass % with respect to the fourth silicone resin composition.

The mixing ratio of the alkenyl group-containing polysiloxane is adjusted such that the number of moles of the alkenyl group in the alkenyl group-containing polysiloxane is smaller than that of the hydrosilyl group in the cage octasilsesquioxane.

That is, the molar ratio (the number of moles of the alkenyl group/the number of moles of the hydrosilyl group) of the alkenyl group to the hydrosilyl group is below 1, for example, 0.10 to 0.99, preferably 0.20 to 0.99, or more preferably 0.50 to 0.99.

When the above-described molar ratio exceeds the above-described range, the hydrosilyl group is fewer than the alkenyl group. In such a case, the excess of the hydrosilyl group does not remain after the reaction and thermosetting properties may not be imparted to the fourth silicone resin composition.

On the other hand, when the above-described molar ratio is below the above-described range, the hydrosilyl group excessively remains and the cage octasilsesquioxanes themselves undergo hydrolysis by moisture in the air and a self-condensation reaction to be cured, so that flexibility may not be obtained.

The mixing ratio of the hydrosilylation catalyst (solid content) is, for example, $1.0 \times 10^{-10}$ to 3 parts by mass, or preferably $1.0 \times 10^{-8}$ to 1 parts by mass with respect to 100 parts by mass of the total amount of the cage octasilsesquioxane and the alkenyl group-containing polysiloxane.

The mixing ratio of the hydroxyl group-containing polysiloxane is adjusted such that the number of moles (X) of the hydroxyl group with respect to the number of moles (Y), which is obtained by subtracting the number of moles of the alkenyl group in the alkenyl group-containing polysiloxane from the number of moles of the hydrosilyl group in the cage octasilsesquioxane, as the molar ratio (X/Y), is, for example, 0.001 to 1000, or preferably 0.01 to 100. In other words, the mixing ratio of the hydroxyl group-containing polysiloxane is, for example, 0.1 to 50 parts by mass, or preferably 1 to 30 parts by mass with respect to 100 parts by mass of the total amount of the cage octasilsesquioxane and the alkenyl group-containing polysiloxane.

To prepare the fourth silicone resin composition, preferably, a silicone resin composition precursor, which is obtained by allowing the cage octasilsesquioxane to react with the alkenyl group-containing polysiloxane in the presence of the hydrosilylation catalyst, and the hydroxyl group-containing polysiloxane are blended.

That is, first, the cage octasilsesquioxane is allowed to react with the alkenyl group-containing polysiloxane in the presence of the hydrosilylation catalyst such that the number of moles of the hydrosilyl group in the cage octasilsesquioxane is larger (excessive) than that of the alkenyl group in the alkenyl group-containing polysiloxane. In this way, the silicone resin composition precursor is obtained.

To be more specific, to obtain the silicone resin composition precursor, the above-described cage octasilsesquioxane and the above-described alkenyl group-containing polysiloxane are blended at the above-described mixing ratio, along with the hydrosilylation catalyst, and the solvent as required, and thereafter, the mixture is heated as required.

Examples of the solvent include an aromatic hydrocarbon such as toluene, an aliphatic hydrocarbon such as hexane, and ester such as ethyl acetate. Preferably, in view of improving compatibility of each of the components, an aromatic hydrocarbon is used, or more preferably, toluene is used.

The reaction temperature is, for example, 0 to 100° C., or preferably 20 to 80° C. and the reaction duration is, for example, 0.5 to 96 hours.

In this way, the cage octasilsesquioxane is allowed to react with the alkenyl group-containing polysiloxane. That is, the hydrosilyl group in the cage octasilsesquioxane and the alkenyl group in the alkenyl group-containing polysiloxane are allowed to undergo the hydrosilylation reaction.

The degree of the hydrosilylation reaction of the hydrosilyl group in the cage octasilsesquioxane with the alkenyl group in the alkenyl group-containing polysiloxane can be checked by $^1$H-NMR measurement based on the intensity of a signal derived from the alkenyl group in the alkenyl group-containing polysiloxane. The hydrosilylation reaction is considered to be terminated at the time of disappearance of the signal.

In the above-described hydrosilylation reaction, the cage octasilsesquioxane is allowed to react with the alkenyl group-containing polysiloxane such that the number of moles of the hydrosilyl group is excessive compared with the number of moles of the alkenyl group. After the reaction, the excess of the hydrosilyl group remains.

In this way, the silicone resin composition precursor is obtained.

The silicone resin composition precursor is in a liquid state or in a semi-solid state.

Next, the obtained silicone resin composition precursor and hydroxyl group-containing polysiloxane are blended at the above-described ratio. By the subsequent heating, the silicone resin composition precursor is allowed to react with the hydroxyl group-containing polysiloxane. The solvent is distilled off as required.

In this way, the fourth silicone resin composition can be obtained.

The obtained fourth silicone resin composition is in a solid state. The fourth silicone resin composition in a solid state is obtained because the mobility of the alkenyl group-containing polysiloxane is decreased due to the steric hindrance of the cage octasilsesquioxane.

The fourth silicone resin composition exhibits the thermoplastic properties based on an increase in mobility of the cage octasilsesquioxane and the alkenyl group-containing polysiloxane by heating.

The thermoplastic temperature of the fourth silicone resin composition is, for example, 40 to 150° C., or preferably 50 to 100° C.

To be specific, the thermosetting properties of the once plasticized fourth silicone resin composition are exhibited by allowing the hydrosilyl group, which remains in the fourth silicone resin composition precursor, to react with the hydroxyl group in the hydroxyl group-containing polysiloxane.

To be more specific, the hydrosilyl group in the cage octasilsesquioxane in the fourth silicone resin composition precursor and the hydroxyl group in the hydroxyl group-containing polysiloxane are allowed to undergo the condensation reaction.

The thermosetting temperature of the fourth silicone resin composition is relatively low and is, for example, 100 to 250° C., or preferably 120 to 250° C. The thermosetting temperature is the temperature at which the fourth silicone resin composition shows thermosetting properties. To be specific, the thermosetting temperature is the temperature at which the plasticized fourth silicone resin composition is cured by heating to be brought into a completely solid state.

The fourth silicone resin composition contains the hydroxyl group-containing polysiloxane, so that the hydroxyl group in the hydroxyl group-containing polysiloxane is allowed to react with the residual hydrosilyl group in the cage octasilsesquioxane and therefore, the cage octasilsesquioxane can be cross-linked. Thus, the flexibility of the fourth silicone resin composition can be improved.

The fourth silicone resin composition can lower its thermosetting temperature (for example, 100 to 250° C.).

The fifth silicone resin composition contains a cage octasilsesquioxane, an alkenyl group-containing polysiloxane, a hydrosilylation catalyst, and an organohydrogenpolysiloxane.

Each example of the cage octasilsesquioxane, the alkenyl group-containing polysiloxane, and the hydrosilylation catalyst in the fifth silicone resin composition includes the same cage octasilsesquioxane, the same alkenyl group-containing polysiloxane, and the same hydrosilylation catalyst as those in the fourth silicone resin composition, respectively. The content of the hydrosilyl group in the organohydrogenpolysiloxane is, for example, 0.01 to 20 mmol/g, or preferably 0.05 to 15 mmol/g.

An example of the organohydrogenpolysiloxane in the fifth silicone resin composition includes the same organohydrogenpolysiloxane as that illustrated in the second silicone resin composition.

The cage octasilsesquioxane, the alkenyl group-containing polysiloxane, the hydrosilylation catalyst, and the organohydrogenpolysiloxane are blended to prepare the fifth silicone resin composition.

The mixing ratio of the cage octasilsesquioxane is, for example, 10 to 80 mass %, or preferably 10 to 70 mass % with respect to the fifth silicone resin composition.

The mixing ratio of the alkenyl group-containing polysiloxane is adjusted such that the number of moles of the alkenyl group in the alkenyl group-containing polysiloxane is smaller than that of the hydrosilyl group in the cage octasilsesquioxane.

That is, the molar ratio (the number of moles of the alkenyl group/the number of moles of the hydrosilyl group) of the alkenyl group to the hydrosilyl group is below 1, for example, 0.10 to 0.99, preferably 0.20 to 0.99, or more preferably 0.50 to 0.99.

When the above-described molar ratio exceeds the above-described range, the hydrosilyl group is fewer than the alkenyl group. In such a case, the excess of the hydrosilyl group does not sufficiently remain after the reaction and thermosetting properties may not be imparted to the fifth silicone resin composition.

On the other hand, when the above-described molar ratio is below the above-described range, the hydrosilyl group excessively remains and the cage octasilsesquioxanes themselves undergo hydrolysis by moisture in the air and a self-condensation reaction to be cured, so that flexibility may not be obtained.

The mixing ratio of the hydrosilylation catalyst (solid content) is, for example, $1.0 \times 10^{-10}$ to 3 parts by mass, or preferably $1.0 \times 10^{-8}$ to 1 parts by mass with respect to 100 parts by mass of the total amount of the cage octasilsesquioxane and the alkenyl group-containing polysiloxane.

The mixing ratio of the organohydrogenpolysiloxane is adjusted such that the number of moles (X) of the hydrosilyl group with respect to the number of moles (Y), which is obtained by subtracting the number of moles of the alkenyl group in the alkenyl group-containing polysiloxane from the number of moles of the hydrosilyl group in the cage octasilsesquioxane, as the molar ratio (X/Y), is, for example, 0.001 to 1000, or preferably 0.01 to 100. In other words, the mixing ratio of the organohydrogenpolysiloxane is, for example, 0.01 to 100 parts by mass, or preferably 0.01 to 50 parts by mass with respect to 100 parts by mass of the total amount of the cage octasilsesquioxane and the alkenyl group-containing polysiloxane.

The mixing ratio of the organohydrogenpolysiloxane with respect to the fifth silicone resin composition as a whole is, for example, 0.01 to 50 mass %, or preferably 0.01 to 30 mass %.

To prepare the fifth silicone resin composition, preferably, a silicone resin composition precursor, which is obtained by allowing the cage octasilsesquioxane to react with the alkenyl group-containing polysiloxane in the presence of the hydrosilylation catalyst, and the organohydrogenpolysiloxane are blended.

That is, first, the cage octasilsesquioxane is allowed to react with the alkenyl group-containing polysiloxane in the presence of the hydrosilylation catalyst at such a mixing ratio that the number of moles of the hydrosilyl group in the cage octasilsesquioxane is larger (excessive) than that of the alkenyl group in the alkenyl group-containing polysiloxane. In this way, the silicone resin composition precursor is obtained.

To be more specific, to obtain the silicone resin composition precursor, the above-described cage octasilsesquioxane and the above-described alkenyl group-containing polysiloxane are blended at the above-described mixing ratio, along with the hydrosilylation catalyst, and the solvent as required, and thereafter, the mixture is heated as required.

Examples of the solvent include an aromatic hydrocarbon such as toluene, an aliphatic hydrocarbon such as hexane, and ester such as ethyl acetate. Preferably, in view of improving compatibility of each of the components, an aromatic hydrocarbon is used, or more preferably, toluene is used.

The reaction temperature is, for example, 0 to 100° C., or preferably 20 to 80° C. and the reaction duration is, for example, 0.5 to 96 hours.

In this way, the cage octasilsesquioxane is allowed to react with the alkenyl group-containing polysiloxane. That is, the hydrosilyl group in the cage octasilsesquioxane and the alkenyl group in the alkenyl group-containing polysiloxane are allowed to undergo the hydrosilylation reaction.

The degree of the hydrosilylation reaction of the hydrosilyl group in the cage octasilsesquioxane with the alkenyl group in the alkenyl group-containing polysiloxane can be checked by $^1$H-NMR measurement based on the intensity of a signal derived from the alkenyl group in the alkenyl group-containing polysiloxane. The hydrosilylation reaction is considered to be terminated at the time of disappearance of the signal.

In the above-described hydrosilylation reaction, the cage octasilsesquioxane is allowed to react with the alkenyl group-containing polysiloxane such that the number of moles of the hydrosilyl group is excessive compared with the number of moles of the alkenyl group. After the reaction, the excess of the hydrosilyl group remains.

In this way, the silicone resin composition precursor is obtained.

The silicone resin composition precursor is in a liquid state or in a semi-solid state.

Next, the obtained silicone resin composition precursor and organohydrogenpolysiloxane are blended at the above-described ratio. By the subsequent heating (described later), the silicone resin composition precursor is allowed to react with the organohydrogenpolysiloxane. The solvent is distilled off as required.

In this way, the fifth silicone resin composition can be obtained.

The obtained fifth silicone resin composition is in a solid state. The fifth silicone resin composition in a solid state is obtained because the mobility of the alkenyl group-containing polysiloxane is decreased due to the steric hindrance of the cage octasilsesquioxane.

In the fifth silicone resin composition, the molar ratio of the monovalent hydrocarbon group: hydrogen in $R^7$ is within a specific range and therefore, in the cage octasilsesquioxane, the ratio of the hydrosilyl group to be reacted with the alkenyl group in the alkenyl group-containing polysiloxane is adjusted. Furthermore, the alkenyl group-containing polysiloxane is allowed to react with the cage octasilsesquioxane such that the alkenyl group thereof has a number of moles that is smaller than the number of moles of the hydrosilyl group in the cage octasilsesquioxane. Therefore, the obtained fifth silicone resin composition can have both thermoplastic and thermosetting properties, while having an excellent transparency and heat resistance.

That is, the fifth silicone resin composition is once plasticized (or liquefied) by the above-described heating and then, is cured by heating.

The fifth silicone resin composition exhibits the thermoplastic properties based on an increase in mobility of the cage octasilsesquioxane and the alkenyl group-containing polysiloxane by heating.

The thermoplastic temperature of the fifth silicone resin composition is, for example, 40 to 150° C., or preferably 50 to 100° C. The thermoplastic temperature is the temperature at which the fifth silicone resin composition shows thermoplastic properties. To be specific, the thermoplastic temperature is the temperature at which the fifth silicone resin composition in a solid state is softened by heating to be brought into a completely liquid state and is substantially the same as the softening temperature.

To be specific, the thermosetting properties of the once plasticized fifth silicone resin composition are exhibited by allowing the hydrosilyl group, which remains in the silicone resin composition precursor, to react with the hydrosilyl group in the organohydrogenpolysiloxane.

To be more specific, the hydrosilyl group in the cage octasilsesquioxane in the silicone resin composition precursor and the hydrosilyl group in the organohydrogenpolysiloxane are allowed to react with moisture in the air (to be hydrolyzed) and undergo a dehydration (intermolecular dehydration) condensation reaction.

The thermosetting temperature of the fifth silicone resin composition is relatively low and is, for example, 100 to 250° C., or preferably 120 to 250° C. The thermosetting temperature is the temperature at which the fifth silicone resin composition shows thermosetting properties. To be specific, the thermosetting temperature is the temperature at which the plasticized fifth silicone resin composition is cured by heating to be brought into a completely solid state.

In the fifth silicone resin composition, the hydrosilyl group in the organohydrogenpolysiloxane is allowed to react with the residual hydrosilyl group in the cage octasilsesquioxane. That is, by the dehydration (intermolecular dehydration) condensation reaction, the cage octasilsesquioxane can be cross-linked. Thus, the flexibility of the fifth silicone resin composition can be improved.

The fifth silicone resin composition can lower its thermosetting temperature (for example, 100 to 250° C.).

The sixth silicone resin composition contains a cage octasilsesquioxane, a polysiloxane containing alkenyl groups at both ends, a hydrosilylation catalyst, and a polysiloxane containing alkenyl groups in its side chain.

Each example of the cage octasilsesquioxane, the polysiloxane containing alkenyl groups at both ends, and the hydrosilylation catalyst in the sixth silicone resin composition includes the same cage octasilsesquioxane as that illustrated in the third silicone resin composition, the same polysiloxane containing alkenyl groups at both ends as that illustrated in the third silicone resin composition, and the same hydrosilylation catalyst as that illustrated in the second silicone resin composition, respectively.

The polysiloxane containing alkenyl groups in its side chain is a polysiloxane containing two or more alkenyl groups in its side chain. Examples of the polysiloxane containing alkenyl groups in its side chain include a straight chain siloxane-containing polysiloxane, which contains alkenyl groups as a side chain bonded to a main chain (a silicon atom of the main chain) containing a straight chain siloxane portion (—Si—O—), and/or, a branched chain siloxane-containing polysiloxane, which contains alkenyl groups bonded to the silicon atom of the branched chain siloxane portion.

To be specific, the straight chain siloxane-containing polysiloxane is represented by the following formula (10).

(10)

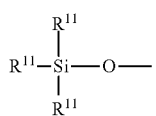

I

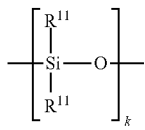

J

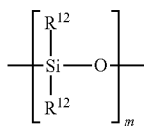

K

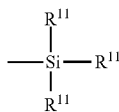

L (where, in formula, I to L represent a constituent unit, I and L represent an end unit, and J and K represent a repeating unit. $R^{11}$ represents a monovalent hydrocarbon group and $R^{12}$ represents an alkenyl group. "k" represents an integer of 0 or 1 or more and "m" represents an integer of 2 or more.)

I to L constitute the straight chain siloxane-containing polysiloxane.

The monovalent hydrocarbon group represented by $R^{11}$ in formula (10) may be the same or different from each other. Preferably, the monovalent hydrocarbon group represented by $R^{11}$ is the same.

An example of the monovalent hydrocarbon group represented by $R^{11}$ includes the same monovalent hydrocarbon group as that represented by $R^{1}$ in the above-described formula (1). As the monovalent hydrocarbon group represented by $R^{11}$, preferably, methyl and phenyl are used, or more preferably, methyl is used.

"k" represents, in view of reactivity and stability, preferably an integer of 1 to 10000, or more preferably an integer of 1 to 5000.

"m" represents, in view of reactivity and stability, preferably an integer of 2 to 500, or more preferably an integer of 2 to 100.

The number average molecular weight of the straight chain siloxane-containing polysiloxane is, in view of stability and handling ability, for example, 200 to 1000000, or preferably 200 to 80000.

The content of the vinyl group in the straight chain siloxane-containing polysiloxane is, for example, 0.01 to 10 mmol/g, or preferably 0.1 to 5 mmol/g. The content of the vinyl group in the straight chain siloxane-containing polysiloxane is measured from the area ratio of the vinyl group to the methyl group with a $^1$H-NMR.

The straight chain siloxane-containing polysiloxane can be, for example, synthesized in accordance with a known method. A commercially available product (for example, manufactured by Gelest, Inc.) can also be used.

To be specific, the branched chain siloxane-containing polysiloxane is represented by the following formula (11).

(11)

$(SiO_{4/2})_n$    M $(R^{13}SiO_{3/2})_p$    N $(R^{13}_2SiO_{2/2})_q$    P $(R^{13}_3SiO_{1/2})_r$    Q (where, in formula, M, N, P, and Q represent a constituent unit, M, N, and P represent a repeating unit, and Q represents an end unit. $R^{13}$ represents a monovalent hydrocarbon group. "n" represents an integer of 1 or more, "p" and "q" represent an integer of 0 or 1 or more, and "r" represents an integer of 4 or more. In addition, per one molecule, at least two $R^{13}$s are an alkenyl group.)

M, N, P, and Q constitute the branched chain siloxane-containing polysiloxane.

Examples of the monovalent hydrocarbon group represented by $R^{13}$ include a saturated hydrocarbon group, an aromatic hydrocarbon group, and an unsaturated hydrocarbon group (excluding the aromatic hydrocarbon group).

An example of the saturated hydrocarbon group and the aromatic hydrocarbon group includes the same monovalent hydrocarbon group as that represented by $R^{1}$ in the above-described formula (1). Preferably, methyl and phenyl are used, or more preferably, methyl is used.

An example of the unsaturated hydrocarbon group (excluding the aromatic hydrocarbon group) includes the same alkenyl group as that represented by $R^{2}$ in the above-described formula (1). Preferably, vinyl is used.

The monovalent hydrocarbon group represented by $R^{13}$ in formula (11) contains at least the alkenyl group, preferably an alkyl group and/or a phenyl group, and the alkenyl group, or more preferably a methyl group and a vinyl group.

The number of the alkenyl group in the branched chain siloxane-containing polysiloxane is 2 or more, preferably 3 or more, and usually is 30 or less.

"n" represents, preferably an integer of 1 to 100, or more preferably an integer of 1 to 50.

"p" represents, preferably an integer of 1 to 100, or more preferably an integer of 1 to 50.

"q" represents, preferably an integer of 1 to 100, or more preferably an integer of 1 to 50.

"r" represents, preferably an integer of 4 to 100, or more preferably an integer of 4 to 30.

The number average molecular weight of the branched chain siloxane-containing polysiloxane is, in view of stability and handling ability, for example, 100 to 10000, or preferably 200 to 8000.

The content of the vinyl group in the branched chain siloxane-containing polysiloxane is, for example, 0.01 to 100 mmol/g, or preferably 0.1 to 10 mmol/g. The content of the vinyl group in the branched chain siloxane-containing polysiloxane is measured from the area ratio of the vinyl group to the methyl group with a $^1$H-NMR.

The branched chain siloxane-containing polysiloxane can be, for example, synthesized in accordance with a known method. A commercially available product (for example, manufactured by Gelest, Inc.) can also be used.

The cage octasilsesquioxane, the polysiloxane containing alkenyl groups at both ends, the hydrosilylation catalyst, and the polysiloxane containing alkenyl groups in its side chain are blended to prepare the sixth silicone resin composition.

The mixing ratio of the cage octasilsesquioxane is, for example, 10 to 80 mass %, or preferably 10 to 70 mass % with respect to the sixth silicone resin composition.

The mixing ratio of the polysiloxane containing alkenyl groups at both ends is adjusted such that the number of moles of the alkenyl group in the polysiloxane containing alkenyl groups at both ends is smaller than that of the hydrosilyl group in the cage octasilsesquioxane.

That is, the molar ratio (the number of moles of the alkenyl group/the number of moles of the hydrosilyl group) of the alkenyl group to the hydrosilyl group is below 1, for example, 0.10 to 0.99, preferably 0.20 to 0.99, or more preferably 0.50 to 0.99. In other words, the mixing ratio of the polysiloxane containing alkenyl groups at both ends is, for example, 0.001 to 30 parts by mass, or preferably 0.01 to 20 parts by mass with respect to 100 parts by mass of the total amount of the cage octasilsesquioxane and the polysiloxane containing alkenyl groups at both ends. Also, the mixing ratio of the polysiloxane containing alkenyl groups at both ends can be set to be, for example, 0.01 to 100 parts by mass, or preferably 0.1 to 50 parts by mass with respect to 100 parts by mass of the total amount of the cage octasilsesquioxane and the polysiloxane containing alkenyl groups at both ends.

When the above-described molar ratio exceeds the above-described range, the hydrosilyl group is fewer than the alkenyl group. In such a case, the excess of the hydrosilyl group does not sufficiently remain after the reaction and thermosetting properties may not be imparted to the sixth silicone resin composition.

On the other hand, when the above-described molar ratio is below the above-described range, the hydrosilyl group excessively remains and the cage octasilsesquioxanes themselves undergo hydrolysis by moisture in the air and a self-condensation reaction to be cured, so that flexibility may not be obtained.

The mixing ratio of the hydrosilylation catalyst (solid content) is, for example, $1.0 \times 10^{-10}$ to 3 parts by mass, or preferably $1.0 \times 10^{-8}$ to 1 parts by mass with respect to 100 parts by mass of the total amount of the cage octasilsesquioxane and the polysiloxane containing alkenyl groups at both ends.

The mixing ratio of the polysiloxane containing alkenyl groups in its side chain is adjusted such that the number of moles (X) of the alkenyl group with respect to the number of moles (Y), which is obtained by subtracting the number of moles of the alkenyl group in the polysiloxane containing alkenyl groups at both ends from the number of moles of the hydrosilyl group in the cage octasilsesquioxane, as the molar ratio (X/Y), is, for example, 0.001 to 1000, or preferably 0.01 to 100.

To prepare the sixth silicone resin composition, preferably, a sixth silicone resin composition precursor, which is obtained by allowing the cage octasilsesquioxane to react with the polysiloxane containing alkenyl groups at both ends in the presence of the hydrosilylation catalyst, and the polysiloxane containing alkenyl groups in its side chain are blended.

That is, first, the cage octasilsesquioxane is allowed to react with the polysiloxane containing alkenyl groups at both ends in the presence of the hydrosilylation catalyst at such a mixing ratio that the number of moles of the hydrosilyl group in the cage octasilsesquioxane is larger (excessive) than that of the alkenyl group in the polysiloxane containing alkenyl groups at both ends. In this way, the sixth silicone resin composition precursor is obtained.

To be more specific, to obtain the sixth silicone resin composition precursor, the above-described cage octasilsesquioxane and the above-described polysiloxane containing alkenyl groups at both ends are blended at the above-described mixing ratio, along with the hydrosilylation catalyst, and the solvent as required, and thereafter, the mixture is heated as required.

Examples of the solvent include an aromatic hydrocarbon such as toluene, an aliphatic hydrocarbon such as hexane, and ester such as ethyl acetate. Preferably, in view of improving compatibility of each of the components, an aromatic hydrocarbon is used, or more preferably, toluene is used.

The reaction temperature is, for example, 0 to 100° C., or preferably 20 to 80° C. and the reaction duration is, for example, 0.5 to 96 hours.

In this way, the cage octasilsesquioxane is allowed to react with the polysiloxane containing alkenyl groups at both ends. That is, the hydrosilyl group in the cage octasilsesquioxane and the alkenyl group in the polysiloxane containing alkenyl groups at both ends are allowed to undergo the hydrosilylation reaction.

The degree of the hydrosilylation reaction of the hydrosilyl group in the cage octasilsesquioxane with the alkenyl group in the polysiloxane containing alkenyl groups at both ends can be checked by $^1$H-NMR measurement based on the intensity of a signal derived from the alkenyl group in the polysiloxane containing alkenyl groups at both ends. The hydrosilylation reaction is considered to be terminated at the time of disappearance of the signal.

In the above-described hydrosilylation reaction, the cage octasilsesquioxane is allowed to react with the polysiloxane containing alkenyl groups at both ends such that the number of moles of the hydrosilyl group is excessive compared with the number of moles of the alkenyl group. After the reaction, the excess of the hydrosilyl group remains.

In this way, the sixth silicone resin composition precursor is obtained.

The sixth silicone resin composition precursor is in a liquid state or in a semi-solid state.

Next, the obtained sixth silicone resin composition precursor and the polysiloxane containing alkenyl groups in its side chain are blended at the above-described ratio. By the subsequent heating (described later), the sixth silicone resin composition precursor is allowed to react with the polysiloxane containing alkenyl groups in its side chain. The solvent is distilled off as required.

In this way, the sixth silicone resin composition can be obtained.

The obtained sixth silicone resin composition is in a solid state. The sixth silicone resin composition in a solid state is obtained because the mobility of the polysiloxane containing alkenyl groups at both ends is decreased due to the steric hindrance of the cage octasilsesquioxane.

In the sixth silicone resin composition, the molar ratio of the monovalent hydrocarbon group: hydrogen in the cage octasilsesquioxane is within a specific range and therefore, in the cage octasilsesquioxane, the ratio of the hydrosilyl group to be reacted with the alkenyl group in the polysiloxane containing alkenyl groups at both ends is adjusted. Furthermore, the polysiloxane containing alkenyl groups at both ends is allowed to react with the cage octasilsesquioxane such that the alkenyl group thereof has a number of moles that is smaller than the number of moles of the hydrosilyl group in the cage octasilsesquioxane. Therefore, the obtained sixth silicone resin composition can have both thermoplastic and thermosetting properties, while having an excellent transparency and heat resistance.

That is, the sixth silicone resin composition is once plasticized (or liquefied) by the above-described heating and then, is cured by heating.

The sixth silicone resin composition exhibits the thermoplastic properties based on an increase in mobility of the cage octasilsesquioxane and the polysiloxane containing alkenyl groups at both ends by heating.

The thermoplastic temperature of the sixth silicone resin composition is, for example, 40 to 150° C., or preferably 50 to 100° C. The thermoplastic temperature is the temperature at which the sixth silicone resin composition shows thermoplastic properties. To be specific, the thermoplastic temperature is the temperature at which the sixth silicone resin composition in a solid state is softened by heating to be brought into a completely liquid state and is substantially the same as the softening temperature.

To be specific, the thermosetting properties of the once plasticized sixth silicone resin composition are exhibited by allowing the hydrosilyl group, which remains in the sixth silicone resin composition precursor, to react with the alkenyl group in the polysiloxane containing alkenyl groups in its side chain.

To be more specific, the hydrosilyl group in the cage octasilsesquioxane in the sixth silicone resin composition precursor and the alkenyl group in the polysiloxane containing alkenyl groups in its side chain are allowed to undergo the hydrosilylation reaction.

The thermosetting temperature of the sixth silicone resin composition is relatively low and is, for example, 100 to 250° C., or preferably 120 to 250° C. The thermosetting temperature is the temperature at which the sixth silicone resin composition shows thermosetting properties. To be specific, the thermosetting temperature is the temperature at which the plasticized sixth silicone resin composition is cured by heating to be brought into a completely solid state.

In the sixth silicone resin composition, the alkenyl group in the polysiloxane containing alkenyl groups in its side chain is allowed to react with the residual hydrosilyl group in the cage octasilsesquioxane and therefore, the cage octasilsesquioxane can be cross-linked. Thus, the flexibility of the sixth silicone resin composition can be improved.

The sixth silicone resin composition can lower its thermosetting temperature (for example, 100 to 250° C.).

Next, the method for producing the phosphor adhesive sheet 1 is described with reference to FIG. 2.

In this method, the phosphor layer 2 is first prepared.

When the phosphor layer 2 is formed of a ceramic of a phosphor (a phosphor ceramic plate), for example, the above-described phosphor is used as a ceramic material and is molded into a plate shape to then be sintered, so that the phosphor layer 2 (phosphor ceramic plate) in a plate shape is obtained.

When the phosphor layer 2 is formed as a phosphor resin sheet, for example, the above-described phosphor resin composition is applied onto the entire upper surface of a release substrate 4 shown in phantom lines in FIG. 1 to form a phosphor film (not shown).

The release substrate 4 is formed of a resin material such as a vinyl polymer including polyolefin (to be specific, polyethylene and polypropylene) and ethylene-vinyl acetate copolymer (EVA); a polyester including polyethylene terephthalate and polycarbonate; and a fluorine resin including polytetrafluoroethylene, and a glass material. The release substrate 4 is also formed of a metal material such as iron, aluminum, or stainless steel. The release substrate 4 has a thickness, for example, 10 to 1000 μm.

After the phosphor resin composition is applied onto the release substrate 4, the formed phosphor film is heated at, for example, 50 to 150° C. to be dried, so that the phosphor layer 2 in a sheet shape is obtained.

Thereafter, the release substrate 4 is peeled off from the phosphor layer 2.

Next, in this method, as shown in the lower portion of FIG. 2 (a), the phosphor layer 2 is heated.

To heat the phosphor layer 2, for example, the phosphor layer 2 is allowed to come in contact with a hot plate 5 as a heat source. To be specific, the phosphor layer 2 is put on the upper surface of the hot plate 5.

The temperature of the hot plate 5 is adjusted to the above-described thermoplastic temperature of the silicone resin composition, which is, to be specific, for example, 40 to 150° C., or preferably 50 to 100° C. The temperature of the hot plate 5 is also, for example, 40 to 200° C., or preferably 80 to 150° C., or, for example, 40 to 150° C., or preferably 50 to 100° C.

Next, as shown by an arrow in FIG. 2 (a), the above-described silicone resin composition is put on the upper surface (one surface in the thickness direction) of the phosphor layer 2.

The shape of the silicone resin composition is not particularly limited and the silicone resin composition is molded as a silicone molded product 6, for example, in a sheet shape, a massive shape (a block shape), a particle shape (a powder shape), or the like.

The silicone molded product 6 is adjusted such that a bottom area S1 (the area of the contact surface which is in contact with the phosphor layer 2; when the silicone molded product is molded into a particle shape, the area of the shadow of the silicone molded product when projected in the thickness direction) thereof is, for example, smaller than an area S2 of the upper surface of the phosphor layer 2 or the same as that.

Preferably, the bottom area S1 of the silicone molded product 6 is smaller than the area S2 of the upper surface of the phosphor layer 2 (S1<S2). To be specific, the ratio (=S1/S2) thereof is, for example, 0.1 or more and below 1, or preferably 0.6 to 0.95.

When the bottom area S1 of the silicone molded product 6 is smaller than the area S2 of the upper surface of the phosphor layer 2 (S1<S2), for example, the silicone molded product 6 is put in the central portion on the upper surface of the phosphor layer 2.

The phosphor layer 2 is put on the hot plate 5, so that the silicone molded product 6 is heated and therefore, is plasticized.

The silicone molded product 6 fluidly moves on the upper surface of the phosphor layer 2 by the above-described plasticization. When the silicone molded product 6 is put in the central portion on the upper surface of the phosphor layer 2, for example, the phosphor layer 2 is diffused outwardly in the plane direction (the direction to be along the upper surface of the phosphor layer 2), to be specific, from the central portion toward the circumference end portion of the phosphor layer 2.

The silicone molded product 6 fluidly moves, for example, without being spilled out of the upper surface of the phosphor layer 2.

In this way, as shown in FIG. 2 (c), the diffused silicone resin composition is laminated on the upper surface of the phosphor layer 2 with a uniform thickness in the plane direction.

Subsequently, the phosphor layer 2 having the upper surface on which the silicone resin composition is diffused is taken out (picked up) from the hot plate 5 and is put on the upper surface of a stand (not shown) at room temperature (20 to 25° C.).

In this way, the silicone resin composition is cooled to be solidified.

In this way, as shown in FIGS. 1 and 2 (c), the adhesive layer 3 in a solid state without a tack is formed on the entire upper surface of the phosphor layer 2.

In this way, as shown in FIG. 1, the phosphor adhesive sheet 1 including the phosphor layer 2 and the adhesive layer 3 laminated on the upper surface thereof is produced.

The phosphor adhesive sheet 1 is, for example, used in various industrial fields. Preferably, the phosphor adhesive sheet 1 is used in the optical field and to be specific, is used as an adhesive sheet for providing the phosphor layer 2 in a light emitting diode package 8 (ref: FIG. 3) and the light emitting diode element 10 (ref: FIGS. 8 and 10).

Next, the method for producing a light emitting diode device 15 using the above-described phosphor adhesive sheet 1 is described with reference to FIG. 3.

First, in this method, as shown in the lower portion of FIG. 3 (a), the light emitting diode package 8 is prepared.

The light emitting diode package 8 includes a board 9, the light emitting diode element 10 mounted on the board 9, a reflector 11 formed on (one side in the thickness direction of) the board 9 and disposed so as to surround the light emitting diode element 10 when projected in the thickness direction, and an encapsulating layer 12 filled in the reflector 11 and encapsulating light emitting diode element 10.

The board 9 is formed into a flat plate shape and an insulating board is formed of, for example, a silicon board, a ceramic board, a polyimide resin board, or the like. Preferably, the board 9 is formed of a ceramic board, to be specific, a sapphire ($Al_2O_3$) board.

On the upper surface of the board 9, a board-side terminal for being electrically connected to an element-side terminal of the light emitting diode element 10 and a conductive pattern 13 provided with a wire, which is continuous to the board-side terminal, are formed. The conductive pattern 13 is formed of, for example, a conductor such as gold, copper, silver, or nickel. The conductors can be used alone or in combination.

The light emitting diode element 10 is mounted on the board 9 and is formed of a known semiconductor material.

The light emitting diode element 10 is flip-chip mounted on or wire bonded to the board 9 by electrically connecting the element-side terminal thereof to the board-side terminal of the board 9.

The reflector 11 is, in plane view, formed into a generally rectangular frame shape or a generally ring shape (a circular ring shape or an elliptical ring shape) with the center thereof open. The reflector 11 is, in sectional view, formed into a generally trapezoidal shape with its width becoming gradually narrow toward the upper side. The reflector 11 is disposed at spaced intervals to the light emitting diode element 10 so as to surround the light emitting diode element 10. That is, the light emitting diode element 10 is disposed inside the reflector 11.

The reflector 11 is formed of, for example, a sintered body of a ceramic material containing a light reflecting component (for example, titanium oxide and the like) and a reflecting resin composition containing a light reflecting component. The reflector 11 reflects light emitted from the light emitting diode element 10.

The encapsulating layer 12 is filled in the reflector 11 and to be specific, is formed so as to cover the inner side surfaces of the reflector 11, the upper surface of the board 9, which is exposed from the light emitting diode element 10, and the upper surface and the outer side surfaces of the light emitting diode element 10.

On the upper surface of the encapsulating layer 12, a concave portion 14, which is gradually dented downward from the circumference end portion toward the central portion, is formed. To be specific, the concave portion 14 is formed as a concave surface, which gradually sinks downward from the inner end portion of the upper surface of the reflector 11 toward the inner side.

An example of the encapsulating resin for forming the encapsulating layer 12 includes a transparent resin such as a silicone resin composition, an epoxy rein, and an acrylic resin. Preferably, in view of durability, a silicone resin composition is used.

The silicone resin composition contains a silicone elastomer and has, in its molecule, a main chain mainly composed of the siloxane bond (—Si—O—Si—) and a side chain, which is bonded to silicon atoms (Si) of the main chain, and composed of an organic group such as an alkyl group (for example, a methyl group and the like) or an alkoxyl group (for example, a methoxy group).

To be specific, examples of the silicone resin composition include a dehydration condensation type silicone resin, an addition reaction type silicone resin, a peroxide curable silicone resin, a moisture curable silicone resin, and a curable silicone resin. Preferably, an addition reaction type silicone resin is used.

The silicone resin composition has a kinetic viscosity at 25° C. in the range of, for example, 10 to 30 $mm^2/s$.

The encapsulating resins can be used alone or in combination of two or more.

To prepare the light emitting diode package 8, first, the board 9 is prepared. Next, the light emitting diode element 10 is mounted on the board 9 and separately, the reflector 11 is formed on the board 9. Thereafter, the encapsulating resin is filled in the reflector 11 to be heated and reacted, so that the encapsulating layer 12 is formed.

As shown in the phantom line in FIG. 3 (a), the encapsulating layer 12 has the upper surface in a flat state before the reaction. As shown in the solid line in FIG. 3 (a), the concave portion 14 in the above-described shape is formed in the encapsulating layer 12 after the reaction.

Next, the light emitting diode package 8 is heated.

To heat the light emitting diode package 8, for example, as referred in FIG. 2 (a), the light emitting diode package 8 is allowed to come in contact with the hot plate 5 as a heat source. To be specific, the light emitting diode package 8 is put on the upper surface of the hot plate 5.

The temperature of the hot plate 5 is adjusted to the above-described thermoplastic temperature of the adhesive layer 3, which is, to be specific, for example, 40 to 150° C., or preferably 50 to 100° C. The temperature of the hot plate 5 can also be adjusted at, for example, 40 to 200° C., or preferably 80 to 150° C., or, for example, 40 to 150° C., or preferably 50 to 100° C.

In this method, the phosphor adhesive sheet 1 shown in FIG. 1 is reversed upside down; as shown in the upper portion of FIG. 3 (a), the reversed phosphor adhesive sheet 1 is disposed in opposed relation to the upper side of the light emitting diode package 8; and subsequently, the phosphor adhesive sheet 1 is put on the upper surface of the light emitting diode package 8 such that the adhesive layer 3 is in contact with the light emitting diode package 8 (the putting step).

As shown in FIG. 3 (b), at the time of the putting, the adhesive layer 3 comes in contact with the upper surface of the reflector 11 without being in contact with the concave portion 14 in the encapsulating layer 12. The light emitting diode package 8 is heated immediately after the putting, so that heat is conducted to the entire adhesive layer 3 via the upper surface of the reflector 11.

Then, as shown in FIG. 3 (c), the adhesive layer 3 (the central portion of the adhesive layer 3) is plasticized to be thus filled in the concave portion 14.

On the other hand, the adhesive layer 3 (the circumference end portion of the adhesive layer 3) in contact with the upper surface of the reflector 11 is formed to be thin by the plasticization. The thickness thereof is, for example, 10 to 90%, or preferably 30 to 60% with respect to the thickness of the adhesive layer 3 before the putting and to be specific, is, for example, 2 to 100 μm, or preferably 5 to 50 μm.

By the plasticization of the adhesive layer 3, the phosphor layer 2 is temporarily fixed to the upper surface of the light emitting diode package 8.

Thereafter, the light emitting diode package 8 is inspected as required. To be specific, the light emitting test of the light emitting diode element 10 is performed by applying an electric current to the conductive pattern 13 of the board 9.

When the light emitting diode package 8 is judged as defective in the above-described inspection, the phosphor adhesive sheet 1 is peeled off from the light emitting diode package 8 and is put on another light emitting diode package 8 (the putting step).

When the light emitting diode package 8 is judged as non-defective in the above-described inspection, the adhesive layer 3 is cured by heating, so that the phosphor layer 2 is adhered to the upper surface (one surface in the thickness direction) of the light emitting diode package 8 (the adhering step).

To cure the adhesive layer 3 by heating, the temperature of the hot plate 5 is increased (allowed to increase) to the thermosetting temperature of the adhesive layer 3. To be specific, the temperature of the hot plate 5 is increased to, for example, 100 to 200° C., or preferably 130 to 200° C., or, for example, 100 to 250° C., or preferably 120 to 250° C.

In this way, the light emitting diode device 15 including the light emitting diode package 8 and the phosphor adhesive sheet 1 adhered to the upper surface of the light emitting diode package 8 is obtained. That is, the light emitting diode device 15 including the light emitting diode package 8 and the phosphor layer 2 adhered to the upper surface thereof via the adhesive layer 3 is obtained.

In the above-described phosphor adhesive sheet 1, the adhesive layer 3 is plasticized by heating, so that the phosphor layer 2 can be temporarily fixed to the light emitting diode package 8.

In the phosphor adhesive sheet 1, the adhesive layer 3 is cured by heating by the subsequent heating, so that the phosphor layer 2 can be adhered to the light emitting diode package 8.

Additionally, in the phosphor adhesive sheet 1, by the plasticization of the adhesive layer 3, a gap 30 (ref: FIG. 3 (b)) can be prevented from being generated between the phosphor layer 2 and the concave portion 14. Therefore, by the subsequent curing by heating of the adhesive layer 3, the phosphor layer 2 can be surely adhered to the encapsulating layer 12 having the concave portion 14.

In addition, the adhesive layer 3 is formed to be thin by the plasticization, so that the thinning of the adhesive layer 3 can be achieved.

That is, in the phosphor adhesive sheet 1, the adhesive layer 3 corresponding to the reflector 11 is formed to be thin, so that in the phosphor layer 2 formed of the ceramic of the phosphor, heat generated by wavelength conversion of light can be efficiently thermal conducted to the board 9 via the adhesive layer 3 and the phosphor layer 2, which has an excellent thermal conductivity.

On the other hand, when the phosphor layer 2 is formed of the phosphor resin composition, the phosphor layer 2 can be easily formed into an arbitrary shape.

In the method for producing the phosphor adhesive sheet 1, the silicone resin composition having both thermoplastic and thermosetting properties is put on the upper surface of the phosphor layer 2 and the silicone molded product 6 made of the put silicone resin composition is plasticized, so that the adhesive layer 3 can be easily and uniformly formed on the upper surface of the phosphor layer 2 by heating.

In this method, the silicone resin composition is cooled to be solidified, so that the adhesive layer 3 is formed. Therefore, the phosphor adhesive sheet 1 including the adhesive layer 3 can be produced with an excellent workability (handling ability).

In the light emitting diode device 15, the adhesive layer 3 is adhered to the upper surface of the light emitting diode package 8, so that the adhesive force of the phosphor layer 2 with respect to the light emitting diode package 8 is improved.

Additionally, the adhesive layer 3 is formed to be thin by the plasticization, so that light emitted from the light emitting diode element 10 can be prevented from being diffused to the outside via the adhesive layer 3 formed on the upper surface of the reflector 11. Therefore, the luminous efficiency of the light emitting diode device 15 can be improved.

In addition, the heat generated by wavelength conversion in the phosphor layer 2 can be efficiently conducted to the reflector 11 and the board 9 via the adhesive layer 3 formed to be thin, so that an efficient diffusion of the heat can be achieved. Therefore, the luminous efficiency of the light emitting diode device 15 can be further improved.

Furthermore, a corroding component (for example, moisture, chlorine, and the like) infiltrating into the light emitting diode package 8 can be prevented from infiltrating thereto via the adhesive layer 3 formed to be thin.

Also, the adhesive layer 3 is cured by heating, so that the durability of the light emitting diode device 15 can be improved.

As a result, the reliability of the light emitting diode device 15 can be improved.

In the method for producing the light emitting diode device 15, the light emitting diode package 8 is heated; the phosphor adhesive sheet 1 is put on the upper surface of the light emitting diode package 8 such that the adhesive layer 3 is in contact with the light emitting diode package 8; and the adhesive layer 3 is plasticized, so that the phosphor layer 2 is temporarily fixed to the upper surface of the light emitting diode package 8.

Additionally, in the phosphor adhesive sheet 1, by the plasticization of the adhesive layer 3, the gap 30 can be prevented from being generated between the phosphor layer 2 and the upper surface of the light emitting diode package 8. Therefore, by the subsequent curing by heating of the adhesive layer 3, the phosphor layer 2 can be surely adhered to the light emitting diode package 8.

Therefore, after the light emitting diode package 8 having the phosphor layer 2 temporarily fixed thereto is subjected to an optical test, thereafter, when the light emitting diode package 8 is defective, the phosphor layer 2 can be peeled off from the light emitting diode package 8 judged as defective to be temporarily fixed (reworked) to another light emitting diode package 8. As a result, the yield rate of the phosphor layer 2 can be improved to reduce the production cost.

In this method, the phosphor layer 2 is adhered to the light emitting diode package 8 by curing the adhesive layer 3 by heating, so that the adhesive force of the phosphor layer 2 with respect to the light emitting diode package 8 can be improved.

In the embodiments in FIG. 2, first, the phosphor layer 2 is heated and then, the silicone molded product 6 is put on the phosphor layer 2. Alternatively, for example, though not shown, the phosphor adhesive sheet 1 can be obtained as follows. Without using the hot plate 5, for example, the phosphor layer 2 at normal temperature is prepared. Separately, a silicone resin composition is plasticized by heating and the plasticized silicone resin composition is applied to the upper surface (one surface in the thickness direction) of the phosphor layer 2. Thereafter, the silicone resin composition is cooled to be solidified, so that the adhesive layer 3 is formed to obtain the phosphor adhesive sheet 1.

The plasticized silicone resin composition is applied to the upper surface of the phosphor layer 2 by, for example, a known application method such as a bar coating.

Also, in this method, the same excellent function and effect as that in the embodiments in FIG. 2 can be achieved.

FIG. 4 shows a perspective view of a package assembly. FIG. 5 shows sectional views for illustrating another embodiment (an embodiment in which the light emitting diode device is produced from the package assembly) of a method for producing the light emitting diode device of the present invention. FIG. 6 shows a sectional view for illustrating another embodiment (an embodiment in which adhesive layers are provided on both surfaces of the phosphor layer) of the phosphor adhesive sheet of the present invention. FIG. 7 shows sectional views for illustrating a method for producing the light emitting diode device by the phosphor adhesive sheet shown in FIG. 6. FIG. 8 shows sectional views for illustrating a method for producing another embodiment (an embodiment in which the phosphor adhesive sheet is laminated on the upper surface of a light emitting diode element) of the light emitting diode device of the present invention. FIG. 9 shows sectional views for illustrating one embodiment of a light emitting diode element including a phosphor layer of the present invention. FIG. 10 shows sectional views for illustrating a method for producing the light emitting diode element including a phosphor layer in FIG. 9 and a method for producing the light emitting diode device using the light emitting diode element including a phosphor layer.

In FIG. 4, the encapsulating layer 12 is omitted. In FIGS. 5, 7, 8, and 10, the conductive pattern 13 is omitted.

In each figure to be described below, the same reference numerals are provided for members corresponding to each of those described above, and their detailed description is omitted.

In the embodiments in FIG. 3, one piece of the light emitting diode package 8 is prepared and one piece of the phosphor adhesive sheet 1 is adhered thereto. Alternatively, for example, as shown in FIG. 4, a package assembly 16 in which a plurality of the light emitting diode packages 8 are disposed in alignment is prepared and as shown in FIG. 5, one piece of the phosphor adhesive sheet 1 is adhered thereto, so that a plurality of the light emitting diode devices 15 can be produced.

That is, in FIGS. 4 and 5 (*a*), the package assembly 16 integrally includes a plurality of the light emitting diode packages 8. Each of the light emitting diode packages 8 is disposed adjacent to each other in the plane direction.

In the package assembly 16, cutting portions 17, each of which is formed between the light emitting diode packages 8 along them, are formed into a generally grid shape in plane view.

The cutting portions 17 are linear portions, which are cut by a dicing process to be described later. The cutting portions 17 include cut-out portions 18, which are formed by cutting out the upper portions of the reflector 11, and through holes 23, which extend through the reflector 11 and the board 9 in the thickness direction. The through holes 23 are formed in portions where a plurality of the cut-out portions 18 intersect with each other. The through hole 23 is formed into a circular shape in plane view.

On the upper surface of the reflector 11, marks 21, each of which is in a generally circular shape in plane view and is dented downward, are formed corresponding to the light emitting diode elements 10.

To prepare the package assembly 16, first, one piece of the board 9 is prepared and then, the reflector 11 is integrally formed. Separately, a plurality of the light emitting diode elements 10 are mounted on the board 9 in openings of the reflector 11. Thereafter, a sealing resin is filled in each of the openings of the reflector 11 to be heated and reacted, so that the encapsulating layer 12 is formed.

The package assembly 16 can also be prepared as a commercially available product.

Next, as shown in FIG. 5 (*a*), the prepared package assembly 16 is put on the upper surface of the hot plate 5 to be heated.

Thereafter, as shown in FIG. 5 (*b*), the phosphor adhesive sheet 1 is put on the upper surface of the package assembly 16 such that the adhesive layer 3 comes in contact with the reflector 11 (the putting step). In this way, as shown in FIG. 5 (*c*), the adhesive layer 3 is plasticized to be thus filled in the concave portions 14.

Thereafter, the inspection of each of the light emitting diode packages 8 is performed as required.

Next, the adhesive layer 3 is cured by heating, so that the phosphor layer 2 is adhered to the upper surface of the package assembly 16 (the adhering step).

In this way, a light emitting diode device assembly 19 including the package assembly 16 and the phosphor adhesive sheet 1 adhered to the upper surface of the package assembly 16 is obtained. That is, the light emitting diode device assembly 19 including the package assembly 16 and the phosphor layer 2 adhered to the upper surface thereof via the adhesive layer 3 is obtained.

Thereafter, as shown in the dash-dot lines in FIG. 5 (*c*), the cutting portions 17 of the light emitting diode device assembly 19 are subjected to a dicing process along the thickness direction, so that the light emitting diode devices 15 are obtained. That is, the light emitting diode device assemblies 19 are singulated (individualized).

In this method, the adhesive layer 3 can also conform to the package assembly 16 having the cut-out portions 18 and the marks 21. That is, the adhesive layer 3 is filled in the upper portions of the cut-out portions 18 and in the marks 21 without any space.

In the embodiment in FIG. 1, the adhesive layer 3 is provided on the upper surface (one surface in the thickness direction) of the phosphor layer 2. Alternatively, for example, as shown in FIG. 6, the adhesive layers 3 can be provided on both surfaces of the upper surface (one surface in the thickness direction) and the lower surface (the other surface in the thickness direction) of the phosphor layer 2.

To provide the adhesive layers 3 on both surfaces of the phosphor layer 2, as referred in FIG. 6, for example, the above-described silicone resin composition is heated to be plasticized and the plasticized resin is applied to the upper surface (one surface) of the phosphor layer 2. Thereafter, the applied phosphor layer 2 is reversed upside down to be applied on the upper surface (the other surface).

In this way, the phosphor adhesive sheet 1 shown in FIG. 6 is obtained.

Next, the method for producing the light emitting diode device assembly 19 using the phosphor adhesive sheet 1 in FIG. 6 is described with reference to FIG. 7.

In this method, as shown in FIG. 7 (*a*), first, the package assembly 16 is prepared.

Next, as shown in FIG. 7 (*b*), the phosphor adhesive sheet 1 is put on the upper surface of the package assembly 16 such that the adhesive layer 3 comes in contact with the reflector 11 (the putting step). In this way, the adhesive layer 3 is plasticized to be thus filled in the concave portions 14.

Thereafter, the inspection of each of the light emitting diode packages 8 is performed as required.

Next, as shown in FIG. 7 (*c*), lenses 22 are provided on the phosphor adhesive sheet 1.

To be specific, the lenses 22 are attached to the plasticized adhesive layer 3 at the upper side thereof so as to correspond to the light emitting diode elements 10.

The lens 22 is formed into a generally hemisphere shape (a generally dome shape) and is a condensing lens, which condenses light emitted from the light emitting diode element 10. The lens 22 is, when projected in the thickness direction, attached so as to include the inside of the reflector 11. The lens 22 is, for example, formed of a transparent resin such as a silicone resin composition.

Thereafter, the light emitting diode packages 8 in which the phosphor adhesive sheet 1 and the lenses 22 are laminated are inspected. For example, whether the optical axis of the light emitted from the light emitting diode element 10 is out of alignment with the optical axis of the lens 22 or not is inspected.

When it is judged that there is no misalignment in position in the above-described inspection, the adhesive layer 3 at the upper side is cured by heating, so that the lenses 22 are adhered to the upper surface of the phosphor layer 2.

On the other hand, when it is judged that there is a misalignment in position in the above-described inspection, as shown by arrows in FIG. 7, the lens 22 is picked up from the phosphor adhesive sheet 1. That is, the lens 22 is peeled off from the plasticized adhesive layer 3 at the upper side thereof (picking).

Thereafter, the lens 22 is again provided on the phosphor adhesive sheet 1 (placement).

Thereafter, when it is again judged that there is no misalignment in position in the same inspection as the description above, thereafter, the adhesive layer 3 at the upper side is cured by heating, so that the lens 22 is adhered to the upper surface of the phosphor layer 2.

Furthermore, when the adhesive layer 3 at the upper side is cured by heating, the adhesive layer 3 at the lower side is also cured by heating at the same time and the phosphor layer 2 is adhered to the upper surface (one surface in the thickness direction) of the light emitting diode packages 8 (the adhering step).

Thereafter, though not shown, the light emitting diode packages 8 are subjected to a dicing process along the cut-out portions 18 (ref: FIG. 5 (*c*)), so that the light emitting diode devices 15 are obtained. That is, the light emitting diode device assemblies 19 are singulated (individualized).

In this method, the phosphor layer 2 can be reworked to the package assembly 16 via the plasticized adhesive layer 3 at the lower side thereof and the lens 22 judged as out of alignment in position can be once peeled off from the plasticized adhesive layer 3 at the upper side thereof to be then reworked (picked and placed) to the upper surface of the phosphor adhesive sheet 1.

In the embodiments in FIGS. 5 and 7, the phosphor adhesive sheet 1 is temporarily fixed and adhered to the upper surfaces of the light emitting diode packages 8 in which the light emitting diode elements 10 are encapsulated. Alternatively, for example, as shown in FIG. 8, the phosphor adhesive sheet 1 can be temporarily fixed and adhered to the upper surface of the light emitting diode element 10.

Next, the light emitting diode device 15 having the phosphor adhesive sheet 1 adhered to the upper surface of the light emitting diode element 10 is described with reference to FIG. 8 (*d*).

As shown in FIG. 8 (*d*), the light emitting diode device 15 includes the board 9, the light emitting diode element 10 mounted on the board 9, the phosphor adhesive sheet 1 adhered to the light emitting diode element 10, and the encapsulating layer 12 covering the side surfaces of the light emitting diode element 10 and the phosphor adhesive sheet 1.

On the upper surface of the light emitting diode element 10, a concavo-convex portion 24 is formed so as to take out light (luminescent light), which is blocked in the light emitting diode element 10 by the total reflection.

In the phosphor adhesive sheet 1, the phosphor layer 2 is adhered to the upper surface of the light emitting diode element 10 via the adhesive layer 3.

The encapsulating layer 12 is formed into a rectangular shape in sectional view along the outer side surfaces of the light emitting diode element 10. The upper surface of the encapsulating layer 12 is formed to be flush with the upper surface of the phosphor layer 2 in the plane direction.

Next, the method for producing the light emitting diode device 15 is described with reference to FIG. 8.

In this method, as shown in the lower portion of FIG. 8 (*a*), first, the light emitting diode element 10 is mounted on the board 9 (the mounting step).

Next, the board 9 is put on the upper surface of the hot plate 5, so that the light emitting diode element 10 is heated.

Next, as shown in FIG. 8 (*b*), the phosphor adhesive sheet 1 is put on the upper surface of the light emitting diode element 10 such that the adhesive layer 3 comes in contact with the light emitting diode element 10 (the putting step). Immediately after the putting, the adhesive layer 3 is plasticized to be thus filled in a concave portion of the concavo-convex portion 24.

In this way, as shown in FIG. 8 (*c*), the phosphor layer 2 is temporarily fixed to the upper surface of the light emitting diode element 10 via the adhesive layer 3.

Thereafter, the light emitting diode element 10 having the phosphor layer 2 temporarily fixed thereto is inspected as required.

Subsequently, the adhesive layer 3 is cured by heating, so that the phosphor layer 2 is adhered to the upper surface of the light emitting diode element 10 (the adhering step).

Next, as shown in the phantom lines and the solid lines in FIG. 8 (*d*), the encapsulating layer 12 is formed so as to cover the upper surface of the phosphor layer 2 and the side surfaces of the phosphor layer 2 and the light emitting diode element 10.

Thereafter, as referred in the solid lines in FIG. 8 (*d*), the upper side portion of the encapsulating layer 12 (the portion located at the upper side with respect to the upper surface of the phosphor layer 2) is removed by, for example, an etching or a mechanical process (to be specific, a grind process or the like). In this way, the upper surface of the phosphor layer 2 is exposed.

In this way, the light emitting diode device 15 is obtained.

In this method, the light emitting diode element 10 is heated; the phosphor adhesive sheet 1 is put on the upper surface of the light emitting diode element 10 such that the adhesive layer 3 is in contact with the light emitting diode element 10; and the adhesive layer 3 is plasticized, so that the phosphor layer 2 is temporarily fixed to the upper surface of the light emitting diode element 10.

Therefore, after the light emitting diode element 10 having the phosphor layer 2 temporarily fixed thereto is subjected to an optical test, thereafter, when the light emitting diode element 10 is defective, the phosphor layer 2 can be peeled off from the light emitting diode element 10 judged as defective by heating to be temporarily fixed (reworked) to another light emitting diode element 10. As a result, the yield rate of the phosphor layer 2 can be improved to reduce the production cost.

In this method, the phosphor layer 2 is adhered to the light emitting diode element 10 by curing the adhesive layer 3 by heating, so that the adhesive force of the phosphor layer 2 with respect to the light emitting diode element 10 can be improved.

Additionally, in the phosphor adhesive sheet 1, by the plasticization of the adhesive layer 3, the gap 30 (ref: FIG. 8 (b)) can be prevented from being generated between the phosphor layer 2 and the upper surface of the light emitting diode element 10 and furthermore, the adhesive layer 3 can also conform to the concavo-convex portion 24 on the upper surface of the light emitting diode element 10. Therefore, by the subsequent curing by heating of the adhesive layer 3, the phosphor layer 2 can be surely adhered to the light emitting diode element 10.

In the embodiments in FIG. 8, the light emitting diode element 10 is heated in advance and then, the phosphor adhesive sheet 1 is put on the upper surface of the light emitting diode element 10, so that the adhesive layer 3 is plasticized. Alternatively, for example, the phosphor adhesive sheet 1 is heated in advance to plasticize the adhesive layer 3 and then, the phosphor adhesive sheet 1 can be temporarily fixed to the upper surface of the light emitting diode element 10 such that the adhesive layer 3 is attached to the light emitting diode element 10.

In the embodiment in FIG. 8, first, the light emitting diode element 10 is mounted on the board 9 (the mounting step, ref: FIG. 8 (a)). Next, the phosphor adhesive sheet 1 is put on the light emitting diode element 10 (the putting step, ref: FIG. 8 (b)) and the phosphor layer 2 is temporarily fixed to the light emitting diode element 10 via the adhesive layer 3 (ref: FIG. 8 (c)). Alternatively, for example, as shown in FIG. 10, the following steps can be used. First, the phosphor adhesive sheet 1 is put on the light emitting diode element 10 without mounting the light emitting diode element 10 on the board 9 (the putting step, ref: FIG. 10 (b)). Next, the phosphor layer 2 is adhered to the light emitting diode element 10 via the adhesive layer 3 (the adhering step), so that a light emitting diode element 7 including a phosphor layer (ref: FIG. 9 (a)) is prepared (ref: FIG. 10 (c)). Thereafter, the light emitting diode element 10 of the light emitting diode element 7 including a phosphor layer is mounted on the board 9 (the mounting step) (ref: FIG. 10 (d)).

As shown in FIG. 9 (a), the light emitting diode element 7 including a phosphor layer includes the light emitting diode element 10 and the phosphor adhesive sheet 1 adhered to the upper surface of the light emitting diode element 10.

To be specific, the adhesive layer 3 is formed on (in close contact with) the upper surface of the light emitting diode element 10. The phosphor layer 2 is formed on the upper surface of the adhesive layer 3. Therefore, the phosphor layer 2 is adhered to the upper surface of the light emitting diode element 10 via the adhesive layer 3.

Next, the method for producing the light emitting diode element 7 including a phosphor layer shown in FIG. 9 (a) and the method for producing the light emitting diode device 15 using the light emitting diode element 7 including a phosphor layer are described with reference to FIG. 10.

In this method, first, the light emitting diode element 7 including a phosphor layer shown in FIG. 9 (a) is prepared.

To prepare the light emitting diode element 7 including a phosphor layer shown in FIG. 9 (a), first, as shown in FIG. 10 (a), for example, the light emitting diode element 10 and a support 25 which supports the light emitting diode element 10 are prepared.

The support 25 is a supporting sheet made of the same material as that of the above-described release substrate 4. The thickness of the support 25 is, for example, 10 to 1000 µm. The support 25 supports the light emitting diode element 10 on the upper surface thereof.

Subsequently, the light emitting diode element 10 and the support 25 are heated. To heat the light emitting diode element 10 and the support 25, for example, the support 25 is put on the upper surface of the hot plate 5.

Next, as shown by the arrows in FIG. 10 (a), the phosphor adhesive sheet 1 is put on the upper surface of the light emitting diode element 10 (the putting step). To be specific, the phosphor adhesive sheet 1 is put on the light emitting diode element 10 such that the adhesive layer 3 is in contact with the light emitting diode element 10.

In this way, as shown in FIG. 10 (b), the adhesive layer 3 is plasticized, so that the phosphor layer 2 is temporarily fixed to the upper surface of the light emitting diode element 10. Subsequently, the adhesive layer 3 is cured by heating, so that the phosphor layer 2 is adhered to the upper surface of the light emitting diode element 10 via the adhesive layer 3 (the adhering step).

In this way, the light emitting diode element 7 including a phosphor layer shown in FIG. 9 (a) is prepared (obtained).

In the light emitting diode element 7 including a phosphor layer, the adhesive layer 3 is adhered to the upper surface of the light emitting diode element 10, so that the adhesive force of the phosphor layer 2 with respect to the light emitting diode element 10 is improved.

Also, the adhesive layer 3 is cured by heating, so that the durability of the light emitting diode element 7 including a phosphor layer can be improved.

As a result, the reliability of the light emitting diode element 7 including a phosphor layer can be improved.

Thereafter, as shown in FIG. 10 (c), the light emitting diode element 7 including a phosphor layer is peeled off from the support 25.

Thereafter, as shown in FIG. 10 (d), the light emitting diode element 7 including a phosphor layer is mounted on the board 9 (the mounting step).

To be specific, an element-side terminal (not shown) of the light emitting diode element 10 in the light emitting diode element 7 including a phosphor layer is electrically connected to a board-side terminal (not shown) of the board 9.

Thereafter, as referred in the solid lines in FIG. 10 (e), the encapsulating layer 12 is formed so as to cover the upper surface of the phosphor layer 2 and the side surfaces of the phosphor layer 2, the adhesive layer 3, and the light emitting diode element 10.

In this way, the light emitting diode device 15 is obtained.

In this method, by the plasticization of the adhesive layer 3, a gap can be prevented from being generated between the phosphor layer 2 and the upper surface of the light emitting diode element 10, or the adhesive layer 3 can also conform to the concavo-convex portion 24 on the upper surface of the light emitting diode element 10. Therefore, by the subsequent curing by heating of the adhesive layer 3, the phosphor layer 2 can be surely adhered to the light emitting diode element 10.

In the embodiment in FIG. 10 (*e*), the upper surface of the light emitting diode element 7 including a phosphor layer is covered by the encapsulating layer 12. Alternatively, for example, as referred in FIG. 8 (*d*), the upper surface of the light emitting diode element 7 including a phosphor layer can be exposed.

In that case, the upper side portion of the encapsulating layer 12 (the portion located at the upper side with respect to the upper surface of the phosphor layer 2) is removed. In this way, the upper surface of the light emitting diode element 7 including a phosphor layer (the phosphor layer 2) is exposed.

In the embodiment in FIG. 10, the light emitting diode element 10 is heated by the hot plate 5 in advance and then, the phosphor adhesive sheet 1 is put on the upper surface of the light emitting diode element 10, so that the adhesive layer 3 is plasticized and cured by heating. Alternatively, for example, the phosphor adhesive sheet 1 is heated in advance to plasticize the adhesive layer 3. Then, the phosphor adhesive sheet 1 is temporarily fixed to the upper surface of the light emitting diode element 10 such that the adhesive layer 3 is attached to the light emitting diode element 10 and thereafter, the adhesive layer 3 can be cured by heating.

In the embodiment in FIG. 9 (*a*), the phosphor adhesive sheet 1 is adhered only to the upper surface of the light emitting diode element 10. Alternatively, for example, as shown in FIG. 9 (*b*), the phosphor adhesive sheet 1 can be adhered to both surfaces of the upper surface and the side surfaces of the light emitting diode element 10.

In the embodiment in FIG. 9 (*b*), the adhesive layer 3 is formed continuously to (in close contact with) both surfaces of the upper surface and the side surfaces of the light emitting diode element 10. The phosphor layer 2 is formed on (in close contact with) the outer top surface of the adhesive layer 3 which is formed on the upper surface and the side surfaces of the light emitting diode element 10. The phosphor layer 2 is, in view of flexibility, preferably formed of a phosphor resin composition (a phosphor resin sheet).

Next, the method for producing the light emitting diode element 7 including a phosphor layer shown in FIG. 9 (*b*) and the method for producing the light emitting diode device 15 using the light emitting diode element 7 including a phosphor layer are described.

In this method, first, the light emitting diode element 7 including a phosphor layer shown in FIG. 9 (*b*) is prepared.

To prepare the light emitting diode element 7 including a phosphor layer shown in FIG. 9 (*b*), first, as shown in the phantom lines in FIG. 10 (*a*), for example, the light emitting diode element 10 and the support 25 are prepared. Next, they are heated.

Subsequently, as shown by the arrows in FIG. 10 (*a*), the phosphor adhesive sheet 1 is put on the light emitting diode element 10 so as to cover the light emitting diode element 10 (the putting step). In this way, as shown in the phantom lines in FIG. 10, and in FIG. 9 (*b*), the adhesive layer 3 is brought into contact with the upper surface and the side surfaces of the light emitting diode element 10.

In this way, the adhesive layer 3 is plasticized and the phosphor layer 2 is temporarily fixed to the upper surface and the side surfaces of the light emitting diode element 10. Subsequently, the adhesive layer 3 is cured by heating, so that the phosphor layer 2 is adhered to the upper surface and the side surfaces of the light emitting diode element 10 (the adhering step).

In this way, the light emitting diode element 7 including a phosphor layer shown in FIG. 9 (*b*) is prepared.

Thereafter, as shown in the phantom lines in FIG. 10 (*c*), the light emitting diode element 7 including a phosphor layer is peeled off from the support 25.

Thereafter, as shown in the phantom lines in FIG. 10 (*d*), the light emitting diode element 7 including a phosphor layer is mounted on the board 9 (the mounting step).

In this way, the light emitting diode device 15 is obtained.

As shown in FIG. 10 (*e*), the light emitting diode element 7 including a phosphor layer is covered by the encapsulating layer 12 as required. To be specific, the light emitting diode element 7 including a phosphor layer is embedded by the encapsulating layer 12. That is, the top surface (including the phantom lines) of the phosphor layer 2 is covered by the encapsulating layer 12.

In the embodiment of producing the light emitting diode device 15 using the light emitting diode element 7 including a phosphor layer in FIG. 9 (*b*), the light emitting diode element 10 and the support 25 are heated in advance and then, the phosphor adhesive sheet 1 is put on the light emitting diode element 10, so that the adhesive layer 3 is plasticized and cured by heating. Alternatively, for example, the phosphor adhesive sheet 1 is heated in advance to plasticize the adhesive layer 3. Then, the phosphor adhesive sheet 1 is temporarily fixed to the upper surface of the light emitting diode element 10 such that the adhesive layer 3 is attached to the light emitting diode element 10 and thereafter, the adhesive layer 3 can be cured by heating.

The above-described light emitting diode device 15 (FIGS. 3 and 10) and light emitting diode device assembly 19 (FIGS. 5 and 7) are used as various light emitting devices and to be specific, are used as a light source, which requires high brightness and high output power. Examples thereof include a back light of a large-scale liquid crystal screen, a variety of lighting equipments, a head light of a car, an advertising sign, and a flash for a digital camera.

EXAMPLES

While the present invention will be described hereinafter in further detail with reference to Production Examples, Prepared Examples, Examples, and Comparative Examples, the present invention is not limited to these Production Examples, Prepared Examples, Examples, and Comparative Examples.

(Production of Phosphor Ceramic Plate)

Production Example 1

A material powder of a phosphor made of 11.35 g of a yttrium oxide particle (purity of 99.99%, lot:N-YT4CP, manufactured by NIPPON YTTRIUM CO., LTD.), 8.560 g of a aluminum oxide particle (purity of 99.99%, trade name "AKP-30", manufactured by Sumitomo Chemical Co., Ltd.), and 0.08750 g of cerium (III) nitrate hexahydrate (purity of 99.99%, trade name "392219", manufactured by Sigma-Aldrich Co. LLC) was prepared.

The components described below were put in a vessel made of alumina, added with an yttrium stabilized zirconia ball with a diameter of 3 mm, and wet blended at a speed of 1500 rpm for 24 hours with a ball mill, so that a slurry solution of the material particle of the phosphor was prepared. The details of the components were as follows: 20 g of the prepared material powder of the phosphor; 1.52 g of PVB (poly (vinyl butyral-co-vinyl alcohol-co-vinyl acetate), manufactured by Sigma-Aldrich Co. LLC.) as a binder resin; 0.400 g of FlowlenG-700 (manufactured by KYOEISHA CHEMICAL CO., LTD) as a dispersant; 0.760 g of BBP (benzyl n-butyl phthalate, manufactured by Alfa Aesar) and 0.760 g of PEG (polyethylene glycol, a weight average molecular weight: 400, manufactured by Sigma-Aldrich Co. LLC.) as a plasticizer; 0.100 g of TEOS (tetraethoxysilane, manufactured by FLUKA TEAM) as a sintering additive; and 13.2 g of toluene as a solvent.

Next, the prepared slurry solution was tape casted on a PET film by a doctor blade method and was dried naturally to form a ceramic green sheet. Thereafter, the ceramic green sheet was peeled off from the PET film, so that a ceramic green sheet having a thickness of 125 μm was obtained.

Thereafter, the obtained green sheet was cut out in the size of 20 mm×20 mm to obtain three pieces thereof. The pieces were stacked to be thermal laminated at a temperature of 90° C. using a biaxial hot press, so that a ceramic green sheet laminate was produced.

Thereafter, a binder removing treatment was performed in which the produced ceramic green sheet laminate was heated up to 800° C. at the temperature rising speed of 1° C./min in the air in an electric muffle furnace to decompose and remove an organic component such as a binder resin. Then, the laminate was transferred into a high-temperature vacuum furnace and was heated up to 1750° C. at the temperature rising speed of 5° C./min under reduced pressure of about $10^{-3}$ Torr ($133 \times 10^{-3}$ N/m$^2$) to be calcined for 5 hours at this temperature, so that a phosphor ceramic plate (a phosphor layer) having a thickness of 310 μm was produced.

(Production of Phosphor Resin Sheet)

Production Example 2

A solution in which a YAG phosphor powder (trade name: BYW01A, an average particle size of 9 μm, manufactured by PhosphorTech Corporation) was dispersed in a two-liquid mixed type thermosetting silicone elastomer (manufactured by Shin-Etsu Chemical Co., Ltd., product name: KER 2500) at a YAG phosphor powder concentration of 25 mass % was applied onto a glass plate using an applicator to form a phosphor film having a thickness of 125 μm. The obtained phosphor film was heated at 100° C. for 1 hour and subsequently, at 150° C. for 1 hour, so that a phosphor resin sheet (a phosphor layer) was produced.

(Synthesis of Cage Octasilsesquioxane)

Synthetic Example 1

35.8 mL (160.6 mol) of tetraethoxysilane was gradually added dropwise into a liquid mixture of 66.8 mL (158.6 mol) of tetramethylammonium hydride (25% methanol solution), 32.8 mL of methanol, and 24.6 mL of distilled water and the mixture was stirred for a whole day to be reacted.

Then, the reaction liquid was filtrated and the filtrate was added dropwise to a liquid mixture of 428 mL of hexane, 7.1 g (75 mmol) of dimethylchlorosilane, and 24.4 g (225 mmol) of trimethylchlorosilane and the mixture was stirred for a whole day. Thereafter, the reactant was extracted with hexane and magnesium sulfate was added to the extract to be dried. Thereafter, hexane was once removed and then, thereafter added again to cause recrystallization, so that a white solid cage octasilsesquioxane was obtained.

It was confirmed by $^1$H-NMR that the obtained cage octasilsesquioxane had the formula (7) structure, and $R^6$ was a methyl group and $R^7$ was hydrogen and a methyl group in formula (7). The molar ratio (the average value in cage octasilsesquioxane as a whole) of the methyl group to hydrogen in $R^7$ was calculated and determined to be methyl group: hydrogen=6:2.

(Preparation of Silicone Resin Composition)

Prepared Example 1

Preparation of Third Silicone Resin Composition 0.3 g of the cage octasilsesquioxane (the methyl group: hydrogen (molar ratio)=6:2 in $R^7$ in formula (7)) of Synthetic Example 1, 0.24 g of a polysiloxane containing alkenyl groups at both ends (in formula (8), $R^8$ is a methyl group, $R^9$ is a vinyl group, "i" is 8, a number average molecular weight of 800, manufactured by Gelest, Inc.), 1 g of toluene, and 0.5 μL of a platinum-divinylsiloxane complex solution (hydrosilylation catalyst, toluene solution, a platinum concentration of 2 mass %) were blended and the mixture was stirred at 50° C. for 15 hours. The molar ratio (=the vinyl group/the hydrosilyl group) of the vinyl group in the polysiloxane containing alkenyl groups at both ends to the hydrosilyl group in the cage octasilsesquioxane was 0.91.

Thereafter, toluene was distilled off, so that a third silicone resin composition in a transparent and solid state was obtained.

Prepared Example 2

Preparation of First Silicone Resin Composition 5 g (0.43 mmol) of a silicone resin composition containing amino groups at both ends (a compound in which all of the $R^1$s are methyl groups and $R^3$ is propylene group, and represented by "a"=150 and "b"=0 in formula (1), a weight average molecular weight of 11400, manufactured by Shin-Etsu Chemical Co., Ltd.), 0.074 g (0.43 mmol) of tolylene 2,4-diisocyanate, and 10 mL of methyl ethyl ketone were stirred and mixed under nitrogen at room temperature (25° C.) for 1 hour. Thereafter, 1315 μL (0.1 mol % of radical generator with respect to 100 mol % of $R^1$ group in silicone resin composition containing amino groups at both ends) of di-t-butyl peroxide (0.1 mol/L benzene solution, manufactured by NOF CORPORATION) was added thereto to be stirred and mixed at room temperature (25° C.) for 1 hour. Thereafter, the solvent was removed under reduced pressure at room temperature (25° C.), so that a first silicone resin composition in a transparent and solid state was obtained.

(Evaluation of Silicone Resin Composition)

Behavior of the third silicone resin composition in Prepared Example 1 and that of the first silicone resin composition in Prepared Example 2 at the time of heating were evaluated, respectively.

To be specific, each of the silicone resin compositions was put on a surface of a hot plate and the hot plate was heated at 30 to 200° C. The thermoplastic temperature and the thermosetting temperature of the silicone resin compositions were observed visually.

The results are shown in Table 1.

TABLE 1

| Prepared Example | Type of Silicone Resin Composition | State of Room Temperature | Thermoplastic Temperature (° C.) | Thermosetting Temperature (° C.) |
|---|---|---|---|---|
| Prepared Example 1 | Third Silicone Resin Composition | Transparent Solid | 70 | 200 |
| Prepared Example 2 | First Silicone Resin Composition | Transparent Solid | 70 | 180 |

(Production of Light Emitting Diode Package)

Production Example 3

A multilayer ceramic board (trade name: 207806, manufactured by Sumitomo Metal (SMI) Electronics Devices Inc.) in which a reflector dividing a concave portion (cavity) in a generally elliptical shape was laminated on a board and a conductive pattern was formed on the board inside of the concave portion was prepared (ref: FIG. 3).

The multilayer ceramic board was formed into a rectangular shape having an outer diameter of 3.5 mm×2.8 mm. The concave portion had an inner diameter of 2.68 mm in a long axis direction and 1.98 mm in a short axis direction and was formed into an elliptical shape. The reflector had a thickness of 0.6 mm.

Next, a blue light emitting diode (LED) chip (trade name: C450EZ1000-0123, manufactured by Cree, Inc.), as a light emitting diode element, was wire bonding connected to the multilayer ceramic board. The blue LED chip was in a rectangular shape and had a size of 980 μm×980 μm×100 μm.

Next, a two-liquid mixed type thermosetting silicone elastomer (trade name: KER 2500, manufactured by Shin-Etsu Chemical Co., Ltd.) was potted in the cavity such that the liquid surface thereof was the same in height as the upper surface of the reflector. Thereafter, the potted product was heated at 100° C. for 1 hour and at 150° C. for 1 hour to be cured.

In this way, an encapsulating layer was formed (ref: the lower portion of FIG. 3 (a)).

On the upper surface of the encapsulating layer, the concave portion, which was dented downward by 65 μm from the circumference end portion toward the central portion, was formed.

In this way, a light emitting diode package was prepared.

(Production of Phosphor Adhesive Sheet and Light Emitting Diode Device)

Example 1

The phosphor ceramic plate in Production Example 1 was subjected to a dicing process to be cut out in the size of 3.5 mm×2.8 mm (S2=9.8 mm$^2$) and the cut-out piece was put on a hot plate, which was heated at 100° C. (ref: FIG. 2 (a)).

Next, 1 mg of a silicone molded product (the projected area 51 in the thickness direction=9.1 mm$^2$) formed of the third silicone resin composition in Prepared Example 1 was put in the center on the upper surface of the phosphor ceramic plate (ref: FIG. 2 (b)).

Then, immediately after the putting, the silicone molded product was plasticized (liquefied) to be uniformly diffused over the entire upper surface of the phosphor ceramic plate (ref: the arrows in FIG. 2 (b)).

Thereafter, the phosphor ceramic plate was taken out from the hot plate to be cooled to the room temperature. In this way, the third silicone resin composition was solidified (ref: FIG. 2 (c)).

In this way, a phosphor adhesive sheet in which an adhesive layer having a thickness of about 100 μm was formed on the phosphor layer was obtained (ref: FIG. 1).

Separately, the light emitting diode package in Production Example 3 was put on the hot plate heated at 70° C. (ref: the lower portion of FIG. 3 (a)). Next, the phosphor adhesive sheet was put on the upper surface of the light emitting diode package such that the adhesive layer came in contact with the light emitting diode package (ref: FIG. 3 (b)).

Then, the adhesive layer was plasticized (softened), so that the phosphor layer was temporarily fixed to the upper surface of the light emitting diode package (ref: FIG. 3 (c)).

Thereafter, the light emitting diode package was taken out from the hot plate and 350 mA of direct current was applied thereto to inspect optical properties thereof as a white light emitting device. As a result, it was confirmed that a desired property value was obtained and again, the light emitting diode package was put on the hot plate to be heated at 200° C. for 30 minutes.

The adhesive layer was once plasticized (liquefied) and subsequently, was cured, so that the phosphor layer was adhered to the light emitting diode package.

In this way, a light emitting diode device was obtained (ref: FIG. 3 (c)).

The thickness of the adhesive layer corresponding to the reflector was 17 μm.

Example 2

A phosphor adhesive sheet was obtained and subsequently, a light emitting diode device was obtained in the same manner as in Example 1, except that the first silicone resin composition in Prepared Example 2 was used instead of the third silicone resin composition in Prepared Example 1 (ref: FIG. 3 (c)).

The thickness of the adhesive layer corresponding to the reflector was 21 μm.

Comparative Example 1

A phosphor sheet was obtained and subsequently, a light emitting diode device was obtained in the same manner as in Example 1, except that a thermosetting gel-like silicone resin composition in a liquid state (trade name "Wacker SilGel 612", manufactured by WACKER ASAHIKASEI SILICONE CO., LTD.) was used instead of the third silicone resin composition in Prepared Example 1.

At the time of production of the phosphor sheet, immediately after the thermosetting gel-like silicone resin composition was applied dropwise to the upper surface of the phosphor ceramic plate, a curing reaction proceeds, while changing its state from liquid to gel, so that the thermosetting gel-like silicone resin composition was cured.

Thereafter, the thermosetting gel-like silicone resin composition was heated for 15 minutes. In this way, a gel-like adhesive layer made of the silicone resin composition after curing was formed.

In this way, the phosphor sheet including the phosphor layer made of the phosphor ceramic plate and the adhesive layer was obtained.

In the obtained light emitting diode device, the thickness of the adhesive layer corresponding to the reflector was 92 μm.

Comparative Example 2

A thermosetting silicone elastomer (trade name "KER²500", manufactured by Shin-Etsu Chemical Co., Ltd.) was applied on the upper surface of the phosphor ceramic plate at normal temperature to form an adhesive layer.

In this way, a phosphor adhesive sheet including the phosphor layer made of the phosphor ceramic plate and the adhesive layer was obtained.

Separately, the phosphor adhesive sheet was put on the upper surface of the light emitting diode package in Production Example 3 such that the adhesive layer came in contact with the light emitting diode package.

Thereafter, the obtained phosphor adhesive sheet was heated at 100° C. for 1 hour and then, 150° C. for 1 hour to cure the adhesive layer.

In this way, a phosphor sheet including the phosphor layer made of the phosphor ceramic plate and the adhesive layer was obtained.

In the obtained light emitting diode device, the thickness of the adhesive layer corresponding to the reflector was 68 μm.

(Production of Package Assembly)

Production Example 4

A package assembly in which a plurality of the light emitting diode packages in Production Example 3 were arranged in alignment in five rows by five columns was prepared (ref: FIG. 4).

In the package assembly, each of the light emitting diode packages was integrally formed, cut-out portions were formed between light emitting diodes, and marks were formed in each of the light emitting diode packages.

(Production of Light Emitting Diode Device Assembly)

Example 3

A phosphor adhesive sheet was produced in the same manner as in Example 1, except that the size of the phosphor ceramic plate in Production Example 1 was changed to 17.5 mm×14.0 mm (the area S2 of the upper surface: 245 mm²) and the placed mass of the third silicone resin composition in Prepared Example 1 was changed to 25 mg (size: 12.0 mm×12.0 mm, the projected area S1 in the thickness direction: 144 mm²) (ref: FIG. 1).

Thereafter, a light emitting diode device assembly was obtained by adhering the phosphor adhesive sheet to the package assembly in the same manner as in Example 1, except that the package assembly in Production Example 4 was used instead of the light emitting diode package in Production Example 3 (ref: FIG. 5 (c)).

Example 4

A light emitting diode device assembly was obtained by adhering the phosphor adhesive sheet to the package assembly in the same manner as in Example 3, except that in the production of the phosphor adhesive sheet in Example 3, the phosphor resin sheet in Production Example 2 was used instead of the phosphor ceramic plate in Production Example 1 and furthermore, the procedure was changed to the following (ref: FIG. 5 (c)).

<Production Procedure of Package Assembly>

First, the phosphor layer made of the phosphor resin sheet in Production Example 2 was cut out in the size of 17.5 mm×14.0 mm to be then put on a hot plate at 70° C.

Separately, the third silicone resin composition in Prepared Example 1 was heated at 100° C. to be liquefied (plasticized). Then, the obtained silicone resin composition was applied on the phosphor layer by a bar coating to form an adhesive layer having a thickness of about 60 μm. Thereafter, the phosphor layer was taken out from the hot plate to be cooled to the room temperature, so that the phosphor adhesive sheet was obtained.

Thereafter, the phosphor adhesive sheet was put and temporarily fixed (ref: FIG. 5 (b)) onto the package assembly (ref: FIG. 5 (a)) heated on the hot plate at 100° C. in Production Example 4 and subsequently, the temperature of the hot plate was increased to 180° C. to cure the adhesive layer by heating, so that the phosphor adhesive sheet was adhered to the package assembly. In this way, the light emitting diode device assembly was produced (ref: FIG. 5 (c)).

Example 5

A phosphor adhesive sheet after being stored was adhered to the package assembly in the same manner as in Example 4, except that the obtained phosphor adhesive sheet was stored at room temperature for 10 days. In this way, a light emitting diode device assembly was produced (ref: FIG. 5 (c)).

(Evaluation)

1. Temporary Fixing

In Examples 1 and 2, in inspecting the optical properties, in a case where the property value was outside of the desired range, it was confirmed that the phosphor layer can be easily replaced when the phosphor adhesive sheet was heated at the temperature more than the thermoplastic temperature to be plasticized (liquefied).

2. Adhesiveness

In the light emitting diode devices in Examples 1 and 2 and the light emitting diode device assemblies in Examples 3 to 5, the adhesiveness of the phosphor layers with respect to the reflectors and the encapsulating layers was good.

On the other hand, in Comparative Example 1, the adhesive layer was in a gel-like state, so that the adhesiveness was not good.

In Comparative Example 2, the adhesive layer was an elastomer, so that the adhesiveness was not good.

3. Workability (Handling Ability)

The adhesive layers in the phosphor adhesive sheets in Examples 1 and 2 were in a solid state, and the workability was good.

Furthermore, in Example 5, the phosphor adhesive sheet was used after being stored for 10 days, so that it was confirmed that the storage of the adhesive layer was easy.

On the other hand, the silicone resin compositions (before curing) used in Comparative Examples 1 and 2 were in a liquid state immediately after the application, so that it was confirmed that the workability was low and furthermore, the storage was difficult.

4. Filling Properties (Conformability) to Concave Portion

In the light emitting diode devices in Examples 1 and 2, when they were observed with an optical microscope, it was confirmed that the adhesive layers were filled in the concave portions in the encapsulating layers.

In addition, in the light emitting diode device assemblies in Examples 3 to 5, it was confirmed that the adhesive layers were filled in the cut-out portions and the marks, in addition to the concave portions in the encapsulating layers.

On the other hand, in Comparative Examples 1 and 2, the filling properties of the adhesive layers to the concave portions were not good.

5. Leakage of Light

In the light emitting diode devices in Examples 1 and 2, the thickness of the adhesive layers corresponding to the reflectors became thin (Example 1: 17 μm, Example 2: 21 μm), so that the leakage of light from the adhesive layers was rarely confirmed visually.

On the other hand, in the light emitting diode devices in Comparative Examples 1 and 2, the thickness of the adhesive layers corresponding to the reflectors was thicker than that in Examples 1 and 2 (Comparative Example 1: 92 μm, Comparative Example 2: 68 μm), so that the leakage (leaking) of light from the adhesive layers was confirmed.

6. Heat Dissipation

In the light emitting diode devices in Examples 1 and 2, when 1 A of high current was applied thereto to measure the surface temperature of the phosphor layers with an infrared camera, each showed 69° C. and 71° C., respectively.

On the other hand, in the light emitting diode devices in Comparative Examples 1 and 2, when 1 A of high current was applied thereto to measure the surface temperature of the phosphor layers with an infrared camera, each showed 102° C. and 94° C., respectively.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A phosphor adhesive sheet comprising:
    a phosphor layer containing a phosphor and
    an adhesive layer laminated on one surface in a thickness direction of the phosphor layer, wherein
    the adhesive layer is formed of a silicone resin composition having both thermoplastic and thermosetting properties.

2. The phosphor adhesive sheet according to claim 1, wherein
    the phosphor layer is formed of a ceramic of the phosphor.

3. The phosphor adhesive sheet according to claim 1, wherein
    the phosphor layer is formed of a phosphor resin composition containing the phosphor and a resin.

4. A method for producing a phosphor adhesive sheet comprising the steps of:
    preparing a phosphor layer containing a phosphor,
    plasticizing a silicone resin composition having both thermoplastic and thermosetting properties to be laminated on one surface in a thickness direction of the phosphor layer, and
    forming an adhesive layer by cooling the silicone resin composition to be solidified.

5. A light emitting diode element including a phosphor layer comprising:
    a light emitting diode element and
    a phosphor adhesive sheet laminated on at least one surface in a thickness direction of the light emitting diode element, wherein
    the phosphor adhesive sheet includes
    a phosphor layer containing a phosphor and
    an adhesive layer laminated on one surface in the thickness direction of the phosphor layer, and
    the adhesive layer is formed of a silicone resin composition having both thermoplastic and thermosetting properties.

6. A light emitting diode device comprising:
    a light emitting diode package, which includes a board, a light emitting diode element mounted on the board, a reflector formed on one side in a thickness direction of the board and disposed so as to surround the light emitting diode element when projected in the thickness direction, and an encapsulating layer filled in the reflector and encapsulating the light emitting diode element; and
    a phosphor adhesive sheet, which is adhered to one surface in the thickness direction of the light emitting diode package, wherein
    the phosphor adhesive sheet includes
    a phosphor layer containing a phosphor and
    an adhesive layer laminated on one surface in the thickness direction of the phosphor layer, and
    the adhesive layer is formed of a silicone resin composition having both thermoplastic and thermosetting properties.

7. A light emitting diode device comprising:
    a board,
    a light emitting diode element mounted on the board, and
    a phosphor adhesive sheet adhered to at least one surface in a thickness direction of the light emitting diode element, wherein
    the phosphor adhesive sheet includes
    a phosphor layer containing a phosphor and
    an adhesive layer laminated on one surface in the thickness direction of the phosphor layer, and
    the adhesive layer is formed of a silicone resin composition having both thermoplastic and thermosetting properties.

8. A method for producing a light emitting diode device comprising the steps of:
    disposing a reflector on one side in a thickness direction of a board so as to surround a light emitting diode element when projected in the thickness direction, along with mounting the light emitting diode element on the board, and thereafter, filling an encapsulating layer in the reflector so as to encapsulate the light emitting diode element to prepare a light emitting diode package;
    putting a phosphor adhesive sheet, which includes a phosphor layer containing a phosphor and an adhesive layer laminated on one surface in the thickness direction of the phosphor layer, on one surface in the thickness direction of the light emitting diode package such that the adhesive layer is in contact with the light emitting diode package;
    temporarily fixing the phosphor layer to one surface in the thickness direction of the light emitting diode package by plasticizing the adhesive layer; and
    adhering the phosphor layer to one surface in the thickness direction of the light emitting diode package by curing the adhesive layer by heating, wherein
    the adhesive layer is formed of a silicone resin composition having both thermoplastic and thermosetting properties.

9. A method for producing a light emitting diode device comprising the steps of:
    putting a phosphor adhesive sheet, which includes a phosphor layer containing a phosphor and an adhesive layer laminated on one surface in a thickness direction of the phosphor layer, on at least one surface in the thickness direction of a light emitting diode element such that the adhesive layer is in contact with the light emitting diode element;

temporarily fixing the phosphor layer to at least one surface in the thickness direction of the light emitting diode element by plasticizing the adhesive layer; and adhering the phosphor layer to at least one surface in the thickness direction of the light emitting diode element by curing the adhesive layer by heating, wherein the adhesive layer is formed of a silicone resin composition having both thermoplastic and thermosetting properties.

10. The method for producing the light emitting diode device according to claim 9, wherein a step of mounting the light emitting diode element on the board is further included and the putting step is performed after the mounting step.

11. The method for producing the light emitting diode device according to claim 9, wherein a step of mounting the light emitting diode element on the board is further included and the mounting step is performed after the adhering step.

12. A method for producing a light emitting diode element including a phosphor layer comprising the steps of:

putting a phosphor adhesive sheet, which includes a phosphor layer containing a phosphor and an adhesive layer laminated on one surface in a thickness direction of the phosphor layer, on at least one surface in the thickness direction of a light emitting diode element such that the adhesive layer is in contact with the light emitting diode element;

temporarily fixing the phosphor layer to at least one surface in the thickness direction of the light emitting diode element by plasticizing the adhesive layer; and adhering the phosphor layer to at least one surface in the thickness direction of the light emitting diode element by curing the adhesive layer by heating, wherein the adhesive layer is formed of a silicone resin composition having both thermoplastic and thermosetting properties.

* * * * *